United States Patent [19]

Jenkins et al.

[11] Patent Number: 5,410,625
[45] Date of Patent: Apr. 25, 1995

[54] OPTICAL DEVICE FOR BEAM SPLITTING AND RECOMBINING

[75] Inventors: Richard M. Jenkins; John M. Heaton, both of Worcester, United Kingdom

[73] Assignee: The Secretary of State for Defence in Her Britannic Majesty's Government of the United Kingdom of Great Britain and Northern Ireland, Hants, Great Britain

[21] Appl. No.: 64,046

[22] PCT Filed: Dec. 2, 1991

[86] PCT No.: PCT/GB91/02129

§ 371 Date: May 19, 1993

§ 102(e) Date: May 19, 1993

[87] PCT Pub. No.: WO92/11550

PCT Pub. Date: Jul. 9, 1992

[30] Foreign Application Priority Data

Dec. 20, 1990 [GB] United Kingdom ............... 9027657

[51] Int. Cl.⁶ .......................................... G02B 6/12
[52] U.S. Cl. .......................... 385/28; 385/130
[58] Field of Search .................. 385/27, 28, 39, 43, 385/123, 129, 130

[56] References Cited

U.S. PATENT DOCUMENTS

| | | | |
|---|---|---|---|
| 3,750,183 | 7/1973 | Drabowitch | 343/786 |
| 3,832,029 | 8/1974 | Bryngdahl | 385/116 |
| 3,969,016 | 7/1976 | Kaiser et al. | 385/28 |
| 4,087,159 | 5/1978 | Ulrich | 385/6 |
| 4,093,343 | 6/1978 | Hargrove | 385/28 X |
| 4,150,870 | 4/1979 | d'Auria | 385/16 |
| 4,711,514 | 12/1987 | Tangonan et al. | 385/43 X |
| 4,950,045 | 8/1990 | Bricheno et al. | 385/24 |
| 4,975,237 | 12/1990 | Brown | 356/338 |
| 5,048,909 | 9/1991 | Henry et al. | 385/27 |
| 5,093,876 | 3/1992 | Henry et al. | 385/28 |
| 5,239,598 | 8/1993 | Wight et al. | 385/8 |

FOREIGN PATENT DOCUMENTS

| | | |
|---|---|---|
| 0330457A3 | 8/1989 | European Pat. Off. |
| 0330539 | 8/1989 | European Pat. Off. |
| 0395060 | 10/1990 | European Pat. Off. |
| 2634288 | 1/1990 | France |
| 1525492 | 9/1978 | United Kingdom |
| 2207525 | 2/1989 | United Kingdom |

OTHER PUBLICATIONS

Simon et al.; Applied Physics Letters, vol. 31, No. 2, Jul. 1977; "Fiber-optical interferometer"; pp. 77–79.

Niemeier et al.; Optics Letters, vol. 11, No. 10, Oct. 1986; "Quadrature outputs from fiber interferometer with 4×4 coupler"; pp. 677–679.

Croston et al.; IEEE Photonics Technology Letters, vol. 2, No. 10, Oct. 1990; "A Highly Dispersive Wave- (List continued on next page.)

*Primary Examiner*—Akm E. Ullah
*Attorney, Agent, or Firm*—Nixon & Vanderhye

[57] ABSTRACT

An optical device (10) for use in beamsplitting, recombination and related applications incorporates a rectangular multimode waveguide (20) connecting a first coupling waveguide (18) to two second coupling waveguides (22, 24). The first coupling waveguide (18) operates in its fundamental mode and provides an input which excites a series of symmetric modes of the multimode waveguide (20). Modal dispersion along the multimode waveguide (20) provides for the input excitation (70a) to be transformed into separate output excitations (75a, 75b) cantered on respective second coupling waveguides (22, 24). The radiation intensity distribution (75) goes to zero at multimode waveguide end wall regions (54) between the second coupling waveguides (22, 24). This minimizes reflection and increased beamsplitting efficiency. The device (10) may be operated in reverse as a beam combiner. Further embodiments include a phase-locked laser array (240) in which the second coupling waveguides (258) provide gain and a second multimode waveguide (260) provides phase correction.

16 Claims, 14 Drawing Sheets

OTHER PUBLICATIONS length Division Demultiplexer in InGaAlAs–InP for 1.5 μm Operation"; pp. 734–737.

Drabowitch; Microwave Journal, vol. 9, No. 1, Jan. 1966; "Multimode Antennas"; pp. 41–51.

Laakmann et al.; Applied Optics, vol. 15, No. 5, May 1976; "Waveguides: characteristic modes of hollow rectangular dielectric waveguides"; pp. 1334–1340.

Bryngdahl; Journal of the Optical Society of America, vol. 63, No. 4, Apr. 1973; pp. 416–419.

Fielding et al; European Conference on Optical Communications, 1989; pp. 17–21.

Ikegami et al.; Physics World, 91/91; "Passive paths for networks"; pp. 50–54.

Jansen et al.; Applied Physics Letter 55(19), Nov. 1989; "Diffraction–limited operation from monolithically integrated diode laser array and self-imaging (Talbot) cavity"; pp. 1949–1551.

Applied Physics Letters, vol. 31, No. 2, Jul. 1977, (Stuttgart) A. Simon, R. Ulrich: "Fiber–optical interferometer", see pp. 77–79.

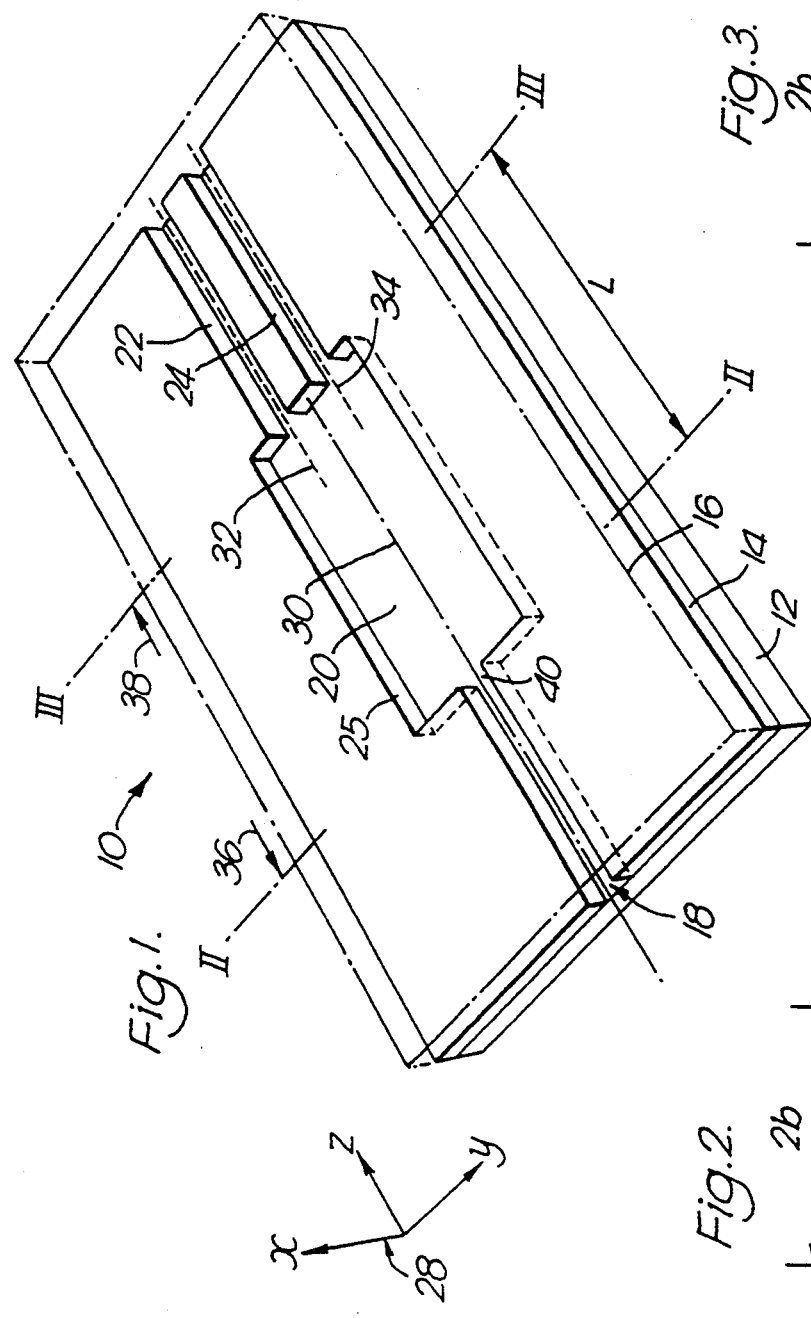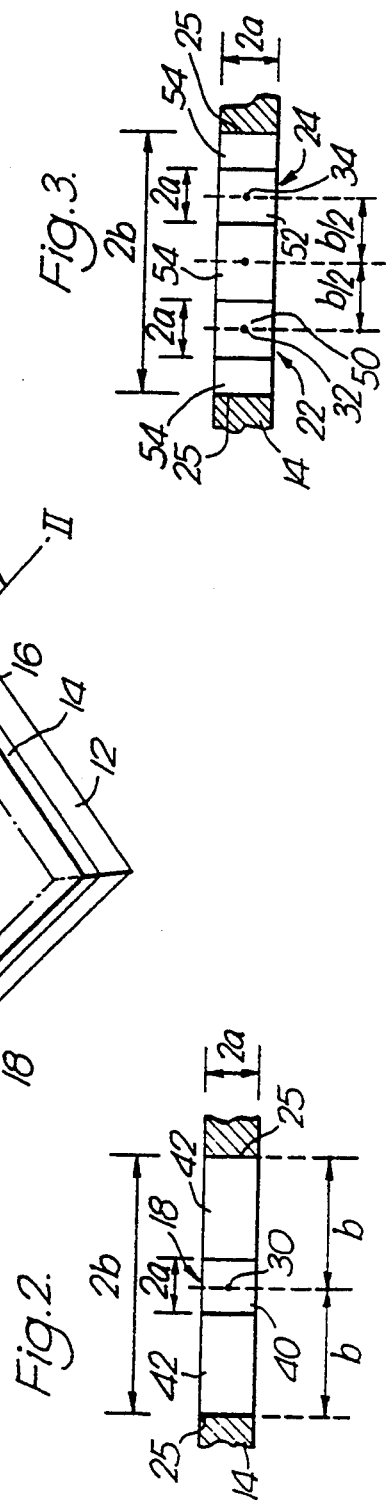

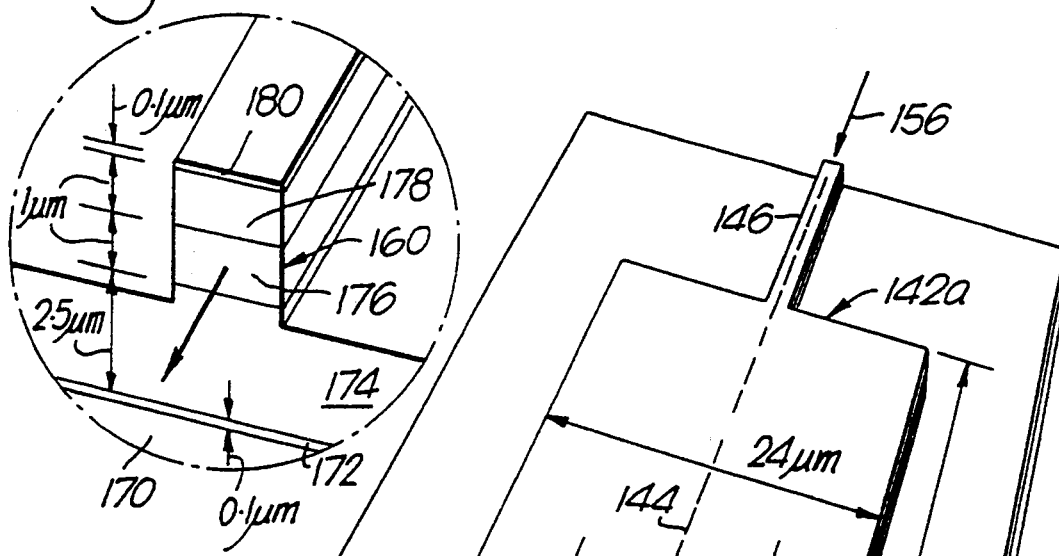
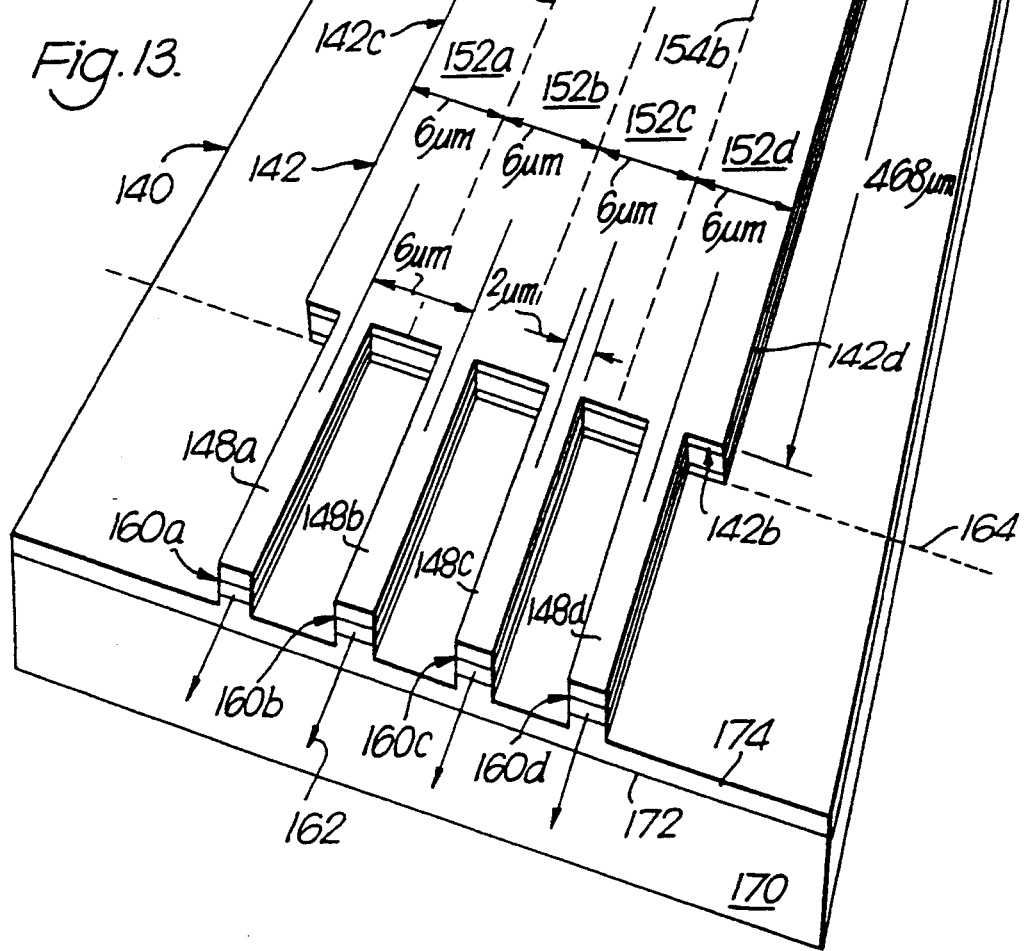

MEASURED INTENSITY AT THE CLEAVED OUTPUT OF GaAs/AlGaAs BEAM SPLITTER.

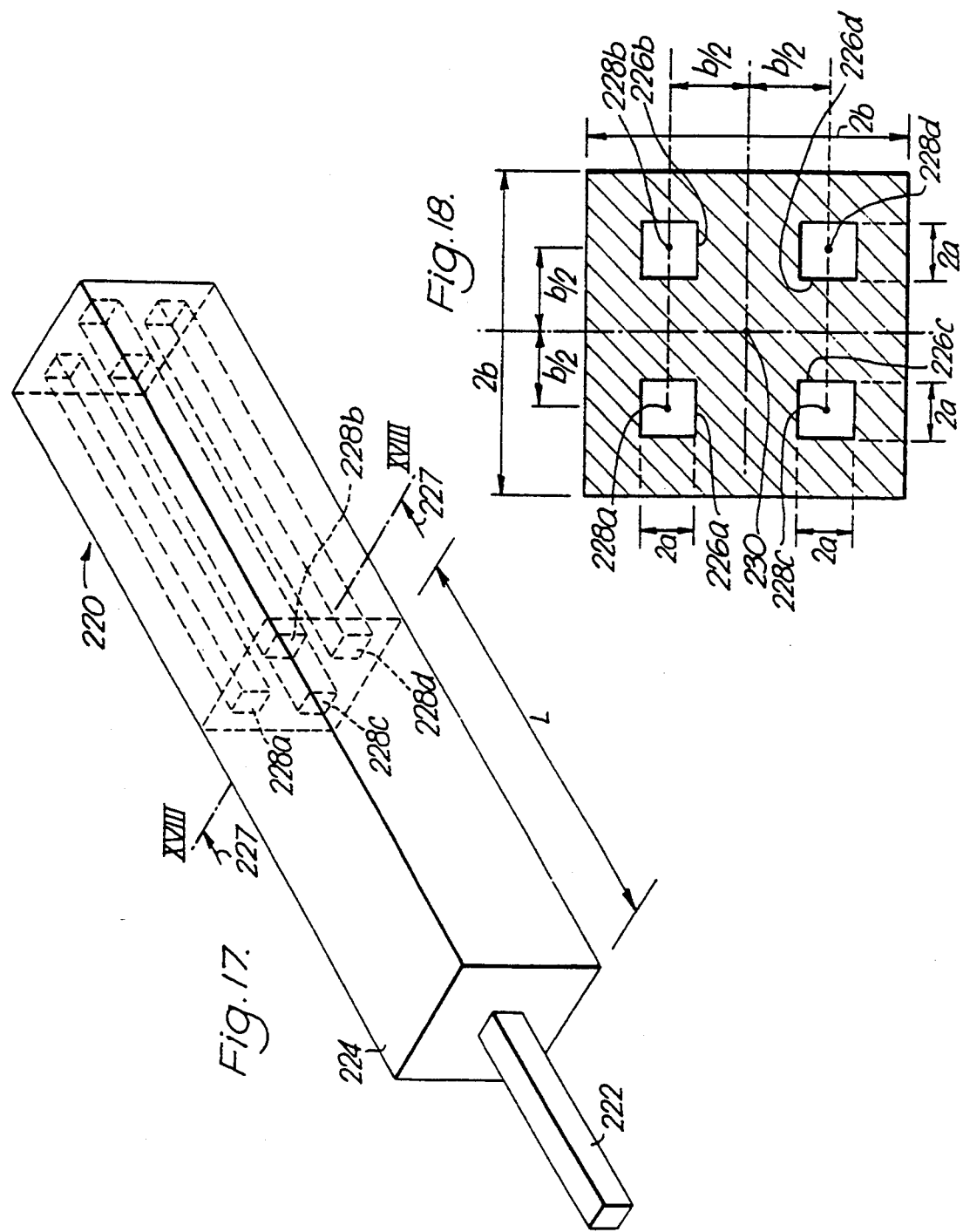

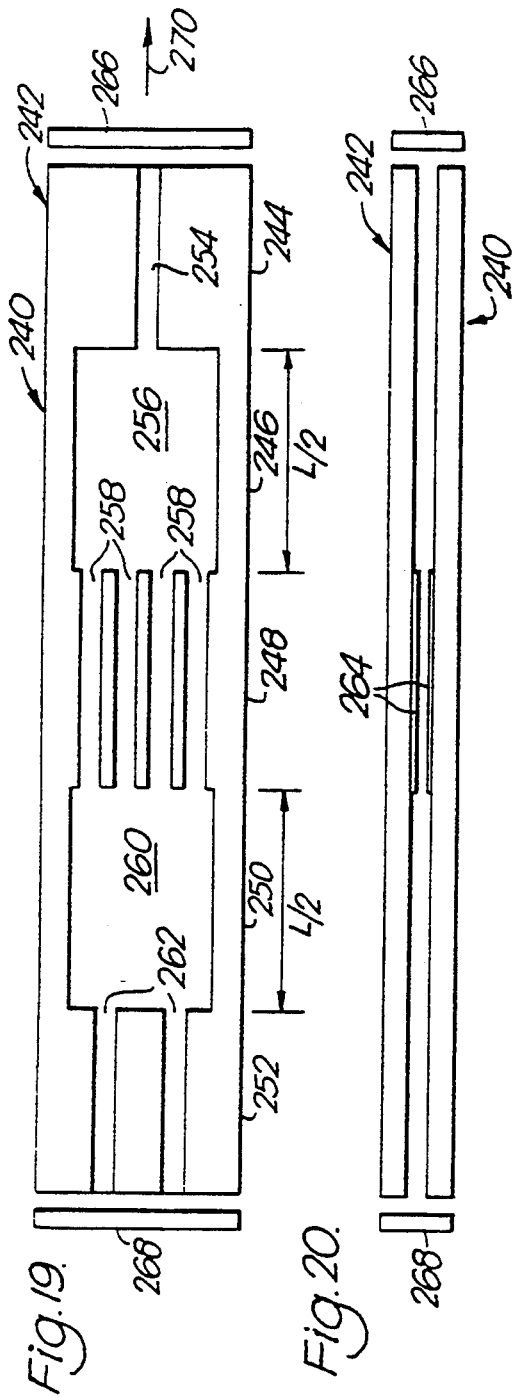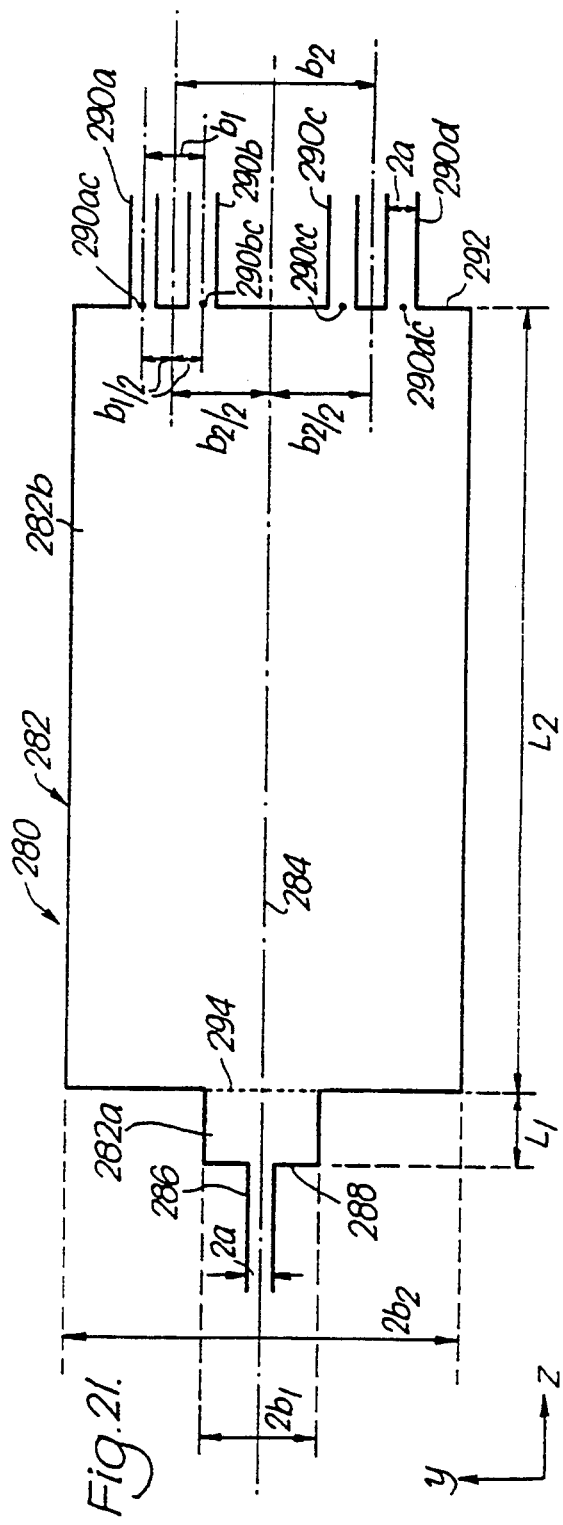

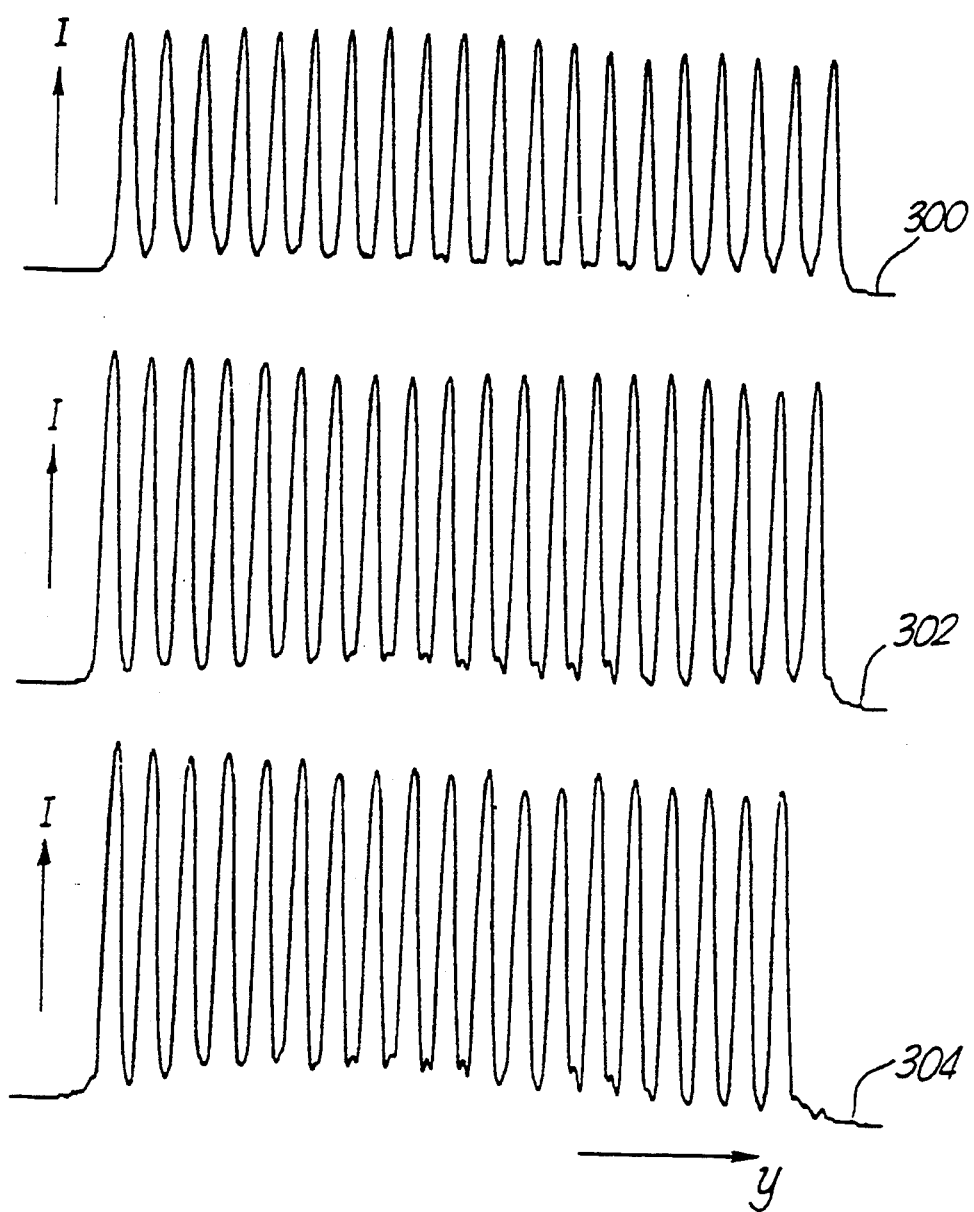

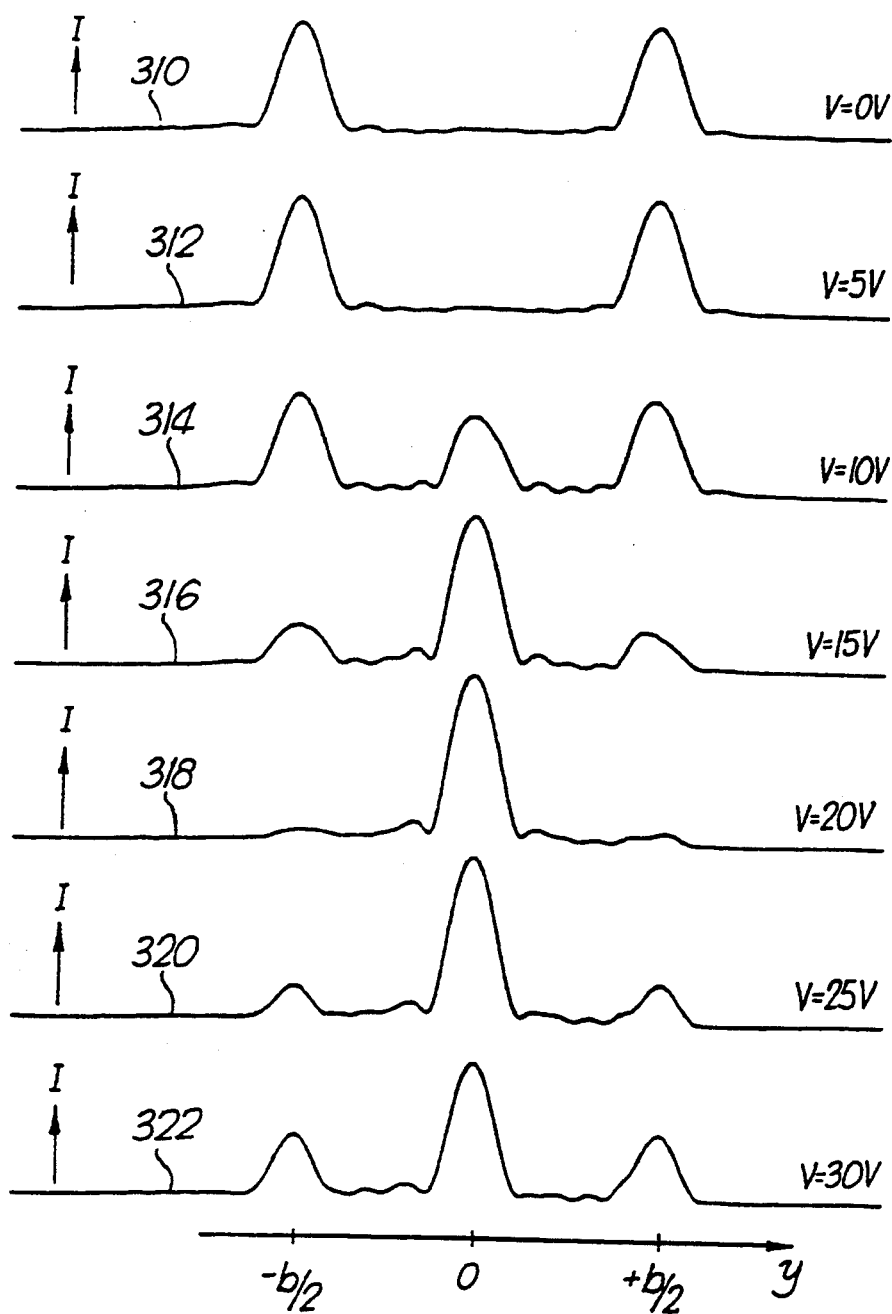

OPTICAL DEVICE FOR BEAM SPLITTING AND RECOMBINING

BACKGROUND OF THE INVENTION

1. Field of the Invention

This invention relates to an optical device. More particularly, it relates to devices for performing beamsplitting and/or recombination functions, and to devices employing such functions.

2. Discussion of Prior Art

The emerging field of integrated optical systems has generated a number of components analogous to those employed in electronic circuits. However, the optical signal division and recombination functions are difficult to implement in efficient, cheap and compact form. Patent Cooperation Treaty Application No PCT/GB 88/00124, (published as WO88/07179 on Sep. 22, 1988 corresponding to U.S. Pat. No. 4,975,237) relates to apparatus for light scattering measurements. It discloses use of fibre optic directional couplers for light beam division (beamsplitting) and recombination in a heterodyne light beating system. The arrangement can become complex in multiple simultaneous measurements, which require a cascaded arrangement of fibre optic couplers. It is neither inexpensive nor efficient in terms of light intensity transfer.

A particular need for multiway beamsplitting occurs in an electro-optic beamsteering device of the kind disclosed in Patent Cooperation Treaty Application No PCT/GB 88/00928 published as WO89/04988 on Jun. 1st, 1989 corresponding to U.S. Pat. No. 5,239,598. This device consists of an array of parallel waveguides of electro-optic material formed in a layered semiconductor structure. The waveguides have optical path lengths controlled by electrical bias applied to them. The array provides a common output beam which is steerable with appropriate applied bias conditions. Such a device requires light from a single source to be divided into a number of equal intensity beams (eg ten) for input to respective waveguides. This implies use of a multiway beamsplitter compatible with a layered semiconductor structure. Such a beamsplitter is not currently available.

In U.S. Pat. No. 3,832,029 and in "Image Formation Using Self-imaging Techniques", Journal of the Optical Society of America, Vol 63, No 4, Apr. 1973 pages 416–419, O Bryngdahl describes the use of a square cross-section optical tunnel to produce a self-image of a symmetrical object. The tunnel is of length $L = n(2d^2/\lambda)$ where n is an integer, d is the width of the tunnel and $\lambda$ is the wavelength of the light in the tunnel. In both references it is suggested that at lengths other than those given above multiple self images may be obtained. These lengths being $L = (n + V/v)2d^2/\lambda$ where V and v are integers with no common factor. However neither reference teaches what length of tunnel is necessary to achieve required numbers of self-images.

It is, however, known to employ a rectangular waveguide in a self-imaging role to provide beamsplitting, recombination and interferometric functions. This is disclosed by A Simon and R Ulrich in Applied Physics Letters, Vol 31, No. 2 Jul. 15, 1977, pages 77 to 79. The device comprises four optically polished glass blocks arranged as walls of a waveguide with rectangular cross-section. The aspect (width to height) ratio $W_y/W_x$ of the waveguide is $\sqrt{2}$; the waveguide has fully reflecting (mirror) side walls and is air cored. It has a length $L = 4W_x^2/\lambda$ (for a core refractive index of 1). The waveguide receives light from an illuminated test object at an off-centre position at one end, and generates two off-centre images at the other end for subsequent output. The off-centre input avoids output image overlap. This is the beamsplitter function. The beam combined function consists of two off-centre images at one end being transformed into two off-centre output images at the other. If the two input images are in phase then one of the two output images is dark. If the two input images are out of phase then both output images will have non zero light intensity. The beam combiner is equivalent to a beamsplitter with two input and two output ports. The interferometer function is produced by arranging two waveguides, a beamsplitter and a beam combiner, in series. The above devices are also described by R Ulrich in U.K. Patent 1 525 492, which also describes a number of other devices. These include devices employing multimode waveguides of varying cross-section to achieve magnification or demagnification.

For acceptable performance, the waveguides employed in the devices described by R Ulrich are required to support about fifty modes. This requires the waveguides to have a high core refractive index to produce high order mode confinement. Liquid-filled waveguides may be used. These are however physically cumbersome arrangements. They do not satisfy the problem of generating compact structures compatible inter alia with layered technologies such as semiconductor lithography.

The problem of dividing and recombining light beams in optical fibre systems has been addressed by A Fielding et al in the Proceedings of the European Conference on Optical Communications Gothenberg, Sweden 1989. The authors point out that tree and star optical couplers are important components for optical communications. An annular waveguide was employed to receive light output from one or more input optical fibres and to divide the light between a number of output optical fibres. The input and output fibres were disposed around the annular space of the annular waveguide. They were arranged so that the or each input fibre produced a pattern of spots centred on respective output fibre apertures. This provided sharing of the input light intensity between the output fibres. However, such annular optical systems are difficult to manufacture, since alignment requires time consuming adjustment. Here again the construction is not compatible with layer technology such as that used in semiconductor processing.

In "Passive Paths for Networks", Physics World, September 1991 pp 50–54, T Ikegami and M Kawachi review the state of the art of passive beamsplitting and recombination devices. They briefly discuss bulk devices such as beamsplitters and prisms. They move on to fibre devices such as fused fibre couplers. They state, however, that such bulk and fibre devices suffer from low productivity, lack of stability and limited suitability for optical circuit integration. They then discuss planar waveguide devices of various forms. These include a device for beamsplitting consisting of a series of Y-junctions, but again this suffers from low efficiency. They also describe an 8×8 star coupler consisting of eight input waveguides, twelve dummy input waveguides, a slab waveguide, eight output waveguides and twelve dummy output waveguides. It accepts eight inputs, mixes them, and distributes them evenly to the eight output waveguides. It may also accept one input and divide it equally between the eight output waveguides. The dummy waveguides are located to either side of the input and output waveguides. They are necessary in order to provide the marginal input and output waveguides with identical conditions to those located centrally. The device is fabricated on a Si substrate 5 mm×26 mm. It exhibits 1.42 dB average excess loss in addition to 8 dB intrinsic coupling loss. Coupling uniformity is claimed to be good with a standard deviation of 0.49 dB.

It is also known to employ complex light beam recombination/division arrangements in active optical devices such as lasers. In U.K. Patent 1 525 492 R Ulrich describes several similar laser-resonator devices. One such device consists of a length $L=4W_x^2/\lambda$ of waveguide with plain mirrors at both ends. Mode control of the cavity may be improved by the use of small plain mirrors positioned to image one another. Their magnitude is sufficient to reflect the images formed but not to reflect spurious light. Another alternative described includes a length $L/2$ of waveguide with a plain mirror at one end and two small apertured plain mirrors at the other end. The apertured mirrors are positioned to image one another. These devices suffer from the same drawbacks as earlier Ulrich devices.

In Appl. Phys. Lett. 55 (19), 6th November 1989, pages 1949–51, M Jansen et al describe a laser device incorporating monolithically integrated laser diodes in a periodic array and a self-imaging Talbot cavity. This employs the Talbot effect in which a transversely disposed, periodically spaced array of light sources reimages periodically at distances which are multiples of a quantity $z_t$; $z_t$ is the Talbot length. It is proportional to the square of the array periodicity. It is a requirement that the array light source outputs be in phase or that adjacent outputs be in antiphase. Jansen et al disclose an array of linear, parallel diodes optically coupled to a Talbot cavity $z_t/2$ in length and having a cleaved end surface. Reflection at the end surface produces a double pass of the Talbot cavity and an optical length of $z_t$. This provides for the diode outputs to be reimaged on to themselves for feedback after mixing in the cavity. The cavity also filters out high order modes nearest a fundamental mode of operation. The cavity feedback strongly couples the array elements, and produces single longitudinal mode operation. It would seem that this feedback also imposes the phase relationship between the array elements which the Talbot effect requires. This arrangement is however unsuitable for single pass multiway beamsplitting, being a feedback device. Furthermore, electrical current is required in the Talbot cavity in addition to the laser waveguides. This is needed for transparency of the cavity. The device is therefore not a passive device, and is unsuitable for passive beam division and recombination applications.

SUMMARY OF THE INVENTION

It is an object of the invention to provide an alternative form of optical device for beamsplitting and/or recombination functions.

The present invention provides an optical device including a multimode waveguide characterised in that:
(a) a first coupling waveguide arranged for fundamental mode operation is ported to the multimode waveguide centrally of the multimode waveguide's transverse cross-section,
(b) at least two second coupling waveguides each arranged for fundamental mode operation are ported to the multimode waveguide with port centres spaced apart across the multimode waveguide's transverse cross-section,
(c) the relative dimensions and positioning of the coupling and multimode waveguides are such that radiation propagating as an in-phase, symmetric fundamental mode of the first coupling waveguide would excite only symmetric modes of the multimode waveguide, and that modes so excited in the multimode waveguide would excite the fundamental mode of each individual second coupling waveguide by virtue of modal dispersion along the path of radiation within the multimode waveguide.

The invention provides the advantage that optical signals are transferable from the first coupling waveguide to each of the second coupling waveguides. With appropriate phasing, light in the second coupling waveguides may be recombined in the first coupling waveguide. Thus the invention is capable of beamsplitting and recombination functions. Furthermore, by virtue of the fundamental mode operation of the first and second coupling waveguides, and the mode mapping therebetween, optical transmission through the device is more efficient than comparable prior art devices. Tests indicate that efficiencies of 75% or more are attainable in a one to two way beamsplitter. Fielding et al quote a 14.3 dB insertion loss, which corresponds to an efficiency of less than 4%. Moreover, by virtue of the restriction to symmetric mode excitation in the multimode waveguide, this waveguide is much more compact that the prior art of Ulrich for example. A length reduction of a factor of 4 is obtainable (comparing devices with like waveguide media). The invention has the further important advantage that it is implementable in layer structure technologies. These include hollow alumina waveguides for $CO_2$ laser radiation and ridge waveguides formed of semiconductor materials for near infrared radiation (eg Nd-YAG laser radiation).

Each coupling waveguide may be arranged for fundamental mode operation by virtue of its not supporting higher order modes. Alternatively, it may be capable of supporting higher order modes; in this case it is arranged for fundamental mode operation by virtue of receiving input radiation in a form which excites only its fundamental mode.

The invention may be a transmissive device, the multimode waveguide having a longitudinal light path. The first and second coupling waveguides are then ported to respective mutually opposite longitudinal end regions of the multimode waveguide. Alternatively, the invention may be a reflective device in which radiation is input to one of the first and second coupling waveguides and is reflected to the other by reflecting means within the multimode waveguide. The reflecting means may be retroreflecting, in which case the first and second coupling waveguides are ported to a common longitudinal end region of the multimode waveguide.

In a preferred embodiment, the invention employs a multimode waveguide of rectangular cross-section. The cross-section may be constant, or alternatively it may have a longitudinal taper. The multimode waveguide may be arranged for fundamental mode operation in one transverse dimension and multimode operation in the orthogonal transverse dimension. In this case the multimode and coupling waveguides have central axes that are substantially coplanar and parallel. The invention is however not greatly sensitive to minor divergences from parallelism and coplanarity. The invention may be arranged as a 1-to-N way beamsplitter (N=1,2,3 . . . ). The multimode waveguide is then of length $4Mb^2/N\lambda$, where 2b is the multimode waveguide width in its multimode dimension, M is the ratio of the width of the second end region to that of the first, and $\lambda$ is the optical operating wavelength within the multimode waveguide. The second end region of the multimode waveguide is notionally divided into N equal transverse subdivisions each connected concentrically to a respective second coupling waveguide.

BRIEF DESCRIPTION OF THE DRAWINGS

In order that the invention might be more fully understood, embodiments thereof will now be described, by way of example only, with reference to the accompanying drawings, in which:

FIG. 1 is a perspective view of an optical device of the invention in the form of a beamsplitter;

FIGS. 2 and 3 are sections on lines II—II and III—III respectively in FIG. 1;

FIGS. 13 and 14 illustrate in perspective an optical beamsplitter of the invention formed of ridge waveguides;

FIG. 17 illustrates schematically an alternative form of beamsplitter of the invention providing two dimensional beam division;

FIG. 18 is a section on lines XVIII—XVIII in FIG. 17;

FIGS. 19 and 20 are respectively schematic sectional plan and side elevations of an optical device of the invention configured as a laser;

FIG. 21 is a schematic sectional plan view of a further embodiment of the invention incorporating a compound multimode waveguide;

FIG. 22 illustrates results obtained from three one-to-twenty way beamsplitters of the invention; and FIG. 23 illustrates results obtained from a Mach-Zehnder interfometer of the invention.

DETAILED DESCRIPTION OF PREFERRED EMBODIMENTS

Figure 4:
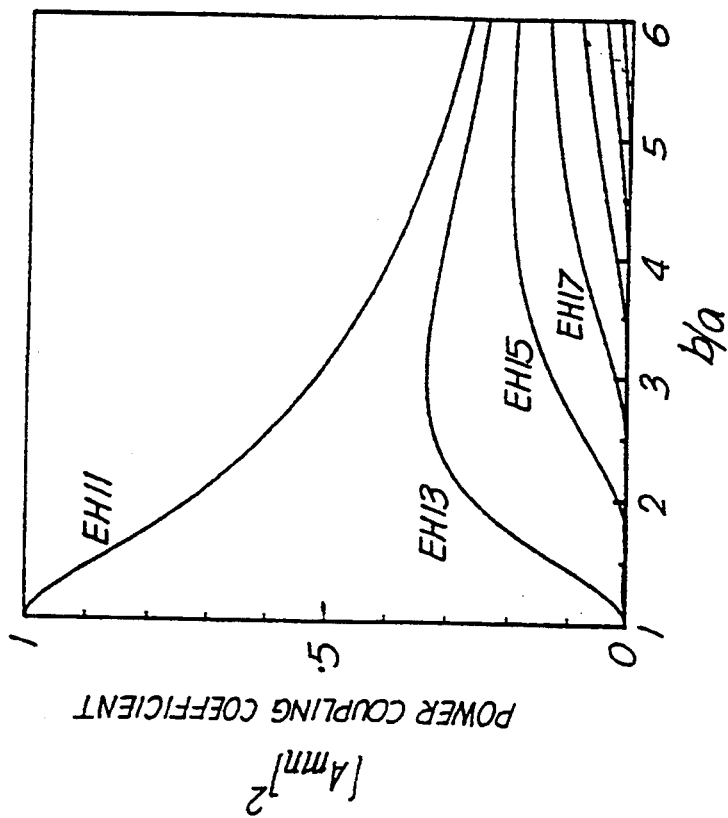
FIGS. 4 and 5 respectively show relative modal amplitude and intensity as a function of the aspect ratio of the multimode central waveguide in FIG. 1.

Referring to FIG. 1, there is shown a perspective view of an optical device of the invention in the form of a beamsplitter indicated generally by 10. The beamsplitter 10 incorporates three successively disposed layers or strata, of which a substrate 12 and a waveguide layer 14 are shown in full. The position of a cover layer is indicated by dotted lines 16.

The waveguide layer 14 is slotted through its full thickness (indicated by shading) to define the following hollow waveguides: an input waveguide 18, a central waveguide 20 and left and right output waveguides 22 and 24. The central waveguide 20 is of constant rectangular cross-section with reflecting sidewalls such as 25; it is of height 2a, width 2b and length L, these dimensions being respectively parallel to x, y and z Cartesian coordinate axes indicated at 28. Of these, x is vertical and y and z are horizontal. The parameters a, b and L are employed to preserve generality, specific values being described later. However, in this example b>2a.

The input and output waveguides, 18, 22 and 24 are of square section with side 2a. The input and central waveguides 18 and 20 share a common central longitudinal axis 30 extending in the z-direction. The output waveguides 18 and 22 have respective axes 32 and 34 parallel to the axis 30 but offset on either side of it in the yz plane. The input, central and output waveguides 18 to 24 each have two horizontal walls and two vertical walls.

Referring now also to FIGS. 2 and 3, in which parts previously described are like referenced, there are shown cross-sectional views on lines II—II and III—III looking in the directions of arrows 36 and 38 respectively. In both cases, the sections are perpendicular to the z axis. FIG. 2 shows an exit aperture 40 of the input waveguide 18 where the latter merges into the central waveguide 20. The aperture 40 acts as an input port to the central waveguide 20. Dotted regions 42 in FIG. 2 indicate a vertical input end wall of the central waveguide 20 formed in the waveguide layer 14. Side walls of the central waveguide 20 are indicated at 25. The aperture 40 is symmetrically located in the end wall 42, its centre is on the axis 30 and distant b from the side walls 25.

FIG. 3 shows respective entrance apertures 50 and 52 of the output waveguides 22 and 24. The apertures 50 and 52 act as output ports of the central waveguide 20. They are located in an output end wall 54 of this waveguide. They are centred on the axes 32 and 34, which are each located b/2 from respective side walls 44 and from the central waveguide axis 30. The axes 32 and 34 are consequently a distance b apart from one another. This locates the output waveguide apertures or ports 50 and 52 (and their centres on axes 32 and 34) symmetrically in respective halves of the cross-section of the central waveguide 20. These halves are defined by a vertical plane through the central axis 30. The port centres on axes 32 and 34 are therefore located periodically (in the spatial sense) across the y dimension of the transverse cross-section of the central waveguide 20.

The operation of the beamsplitter 10 will now be given in general terms, a more detailed theoretical analysis being given later. A light beam provided by input means (not shown) is coupled into the input waveguide 18. The beam has a wavelength $\lambda$ equal to $2b^2/L$. It is directed parallel to the waveguide axis 30, and is of constant phase across the input waveguide cross-section. It has a half-wave sinusoidal intensity distribution in both transverse dimensions, ie the transverse horizontal and transverse vertical dimensions. It consequently excites only the fundamental $EH_{11}{}^S$ mode of the input waveguide 18. The input waveguide 18 could of course support higher order modes, ie $EH_{mn}{}^S$ with m and/or n greater than 1, with different input excitation. The waveguide 18 is therefore arranged for fundamental mode operation by virtue of being employed with a radiation source exciting only that mode. It is also possible as an alternative to employ a monomode input waveguide which supports only the fundamental mode.

Fundamental mode propagation in the input waveguide 18 produces an electric field distribution across this waveguide in the form of a half-period (0 to $\pi$) of a sine function. At the waveguide output aperture 40, this electric field distribution is centred on the axis 30. It excites symmetric modes $EHS_{1n}$ (n odd) of the central waveguide 20, which is a multimode device in the horizontal transverse y direction. In the vertical or x direction, it operates in the fundamental mode only. Antisymmetric modes (n even) of the multimode waveguide 20 are not excited, because the input is (a) coaxial, (b) in a fundamental mode and (c) of constant phase across the input waveguide aperture 40. The field distribution at the aperture 40 centred on the axis 30 becomes decomposed into a linear combination of these modes. The modes have different propagation constants in the z direction along the axis 30 within the central waveguide 20. In consequence, the field distribution in planes parallel to the xy plane varies in the z direction. Because of this variation, the field distribution in the plane of the aperture 40 becomes converted along the length of the central waveguide 20 to two like field distributions at respective entrance apertures 50 and 52 of the output waveguides 22 and 24. These distributions are centred on respective output waveguide axes 32 and 34. The electric field is substantially zero in regions of the end wall 54 between the output apertures 50 and 52 and the side walls 44 and between each other.

Each of the field distributions at apertures 50 and 52 excites a fundamental $EH_{11}^S$ mode of the respective associated output waveguide 22 or 24. Radiation in the central waveguide 20 is therefore coupled efficiently into the output waveguides 22 and 24, which operate as monomode (fundamental mode) devices. There is no significant reflection of radiation from the end wall 54 back towards the input waveguide 18. Consequently, radiation propagates unidirectionally from the input waveguide 18 through the central waveguide 20 and into the output waveguides 22 and 24 without any counterpropagation to alter mode interaction within the central waveguide. The beamsplitter 10 therefore divides an input radiation beam applied to the input waveguide 18 into two output beams emergent from the output waveguides 22 and 24. It does so because the mode structure of the central waveguide 20 converts a single fundamental mode field distribution at one end 42 into two separate similar distributions at the other end 54. This is a specific example of a more general phenomenon, and arises because of the on-axis plane wave excitation of the central waveguide and the aforesaid relationship between the central waveguide length L and the wavelength $\lambda$ given by:

$$L = 2b^2/\lambda \quad (1)$$

where b is the half width of the central waveguide.

As will be described later, changes in the central waveguide length L and in the location and form of the input to it alter the radiation division effects.

The theoretical propagation characteristics of a rectangular waveguide will now be analysed. It is assumed that the waveguide has height 2a, width 2b and is bounded by a homogeneous dielectric material with complex dielectric constant $\epsilon$. It is also assumed that this dielectric material (which provides the waveguide walls) is highly reflecting and not significantly attenuating for required propagating modes. The waveguide has height, width and length dimensions which are parallel to the x, y and z axes respectively. It has normalised linearly polarized modes of the kind $EH_{mn}$. The electric field contribution $E_{mn}(x,y,z)$ of the mnth mode $EH_{mn}$ at the point (x,y,z) has been calculated by Laakmann et al in Appl. Opt. Vol. 15, No. 5, pages 1334–1340, May 1976 as follows:

$$E_{mn}(x,y,z) = \frac{1}{\sqrt{(ab)}} \left[ \begin{array}{c} \cos \\ \sin \end{array}\left( \frac{m\pi x}{2a} \right) \right] \left[ \begin{array}{c} \cos \\ \sin \end{array}\left( \frac{n\pi y}{2b} \right) \right] e^{i\gamma_{mn}z} \quad (2)$$

where
  m is the mode number relating to the field dependency along the x axis,
  n is the mode number relating to the field dependency along the y axis,
  z is the distance along the z axis,
  $\gamma_{mn} = (\beta_{mn} + i\alpha_{mn})$, the propagation constant of the $mn^{th}$ mode, $\beta_{mn}$ and $\alpha_{mn}$ being the $mn^{th}$ mode's phase and attenuation coefficients, and
  "cos" above "sin" indicates the former applies to even mode numbers (m or n as appropriate) and the latter to odd mode numbers.

The phase coefficient $\beta_{mn}$ is given by:

$$\beta_{mn} = \frac{2\pi}{\lambda} \left[ 1 - \left\{ \left( \frac{\lambda m}{4a} \right)^2 + \left( \frac{\lambda n}{4b} \right)^2 \right\} \right]^{\frac{1}{2}} \quad (3.1)$$

If the negative term in parenthesis in Equation (3.1) is small compared with unity (paraxial radiation approximation), which is satisfied in practice, then the binomial theorem may be used to rewrite Equation (3.1) as:

$$\beta_{mn} = \frac{2\pi}{\lambda} \left[ 1 - \frac{1}{2}\left\{ \left( \frac{\lambda m}{4a} \right)^2 + \left( \frac{\lambda n}{4b} \right)^2 \right\} \right] \quad (3.2)$$

where a, b, m and n are as previously defined, and $\lambda$ is the free space wavelength of the radiation propagating in the waveguide.

Equation (2) sets out the electric field contributions obtainable from all linearly polarized modes of a rectangular waveguide. It is calculated on the basis that the electric field contribution of each mode is zero at the side walls of the waveguide, ie at $y = +b$ and $-b$ where $y=0$ on the axis 30. This is satisfied if the central waveguide has reflecting side walls 25. Not all central waveguide modes are necessarily excited by a given input. In the case of the beamsplitter 10 of FIGS. 1 to 3, the heights of the input and central waveguides 18 and 20 are matched and equal to 2a. The input waveguide 18 supplies an excitation in the form of its fundamental or lowest order mode $EH_{11}^S$. This is coupled to the various $EH_{mn}$ modes of the rectangular central guide 20. The input $EH_{11}^S$ mode consequently becomes decomposed into a linear combination of the $EH_{mn}$ modes with respective complex multiplicative coefficients $A_{mn}$. This is expressed by:

$$EH_{11}^S = \Sigma A_{mn} \cdot EH_{mn} \quad (4)$$

Essentially the $A_{mn}$ amplitude coupling coefficients are the coefficients of a Fourier series which represents the field at the input waveguide aperture 40. The $EH_{mn}$ modes are mutually orthogonal, and in consequence the coefficients $A_{mn}$ can be calculated from overlap integrals of the form:

$$A_{mn} = \int_{-b}^{+b} \int_{-a}^{+a} EH_{11}^S \cdot EH_{mn} \cdot dy \cdot dx. \quad (5)$$

Figure 5:
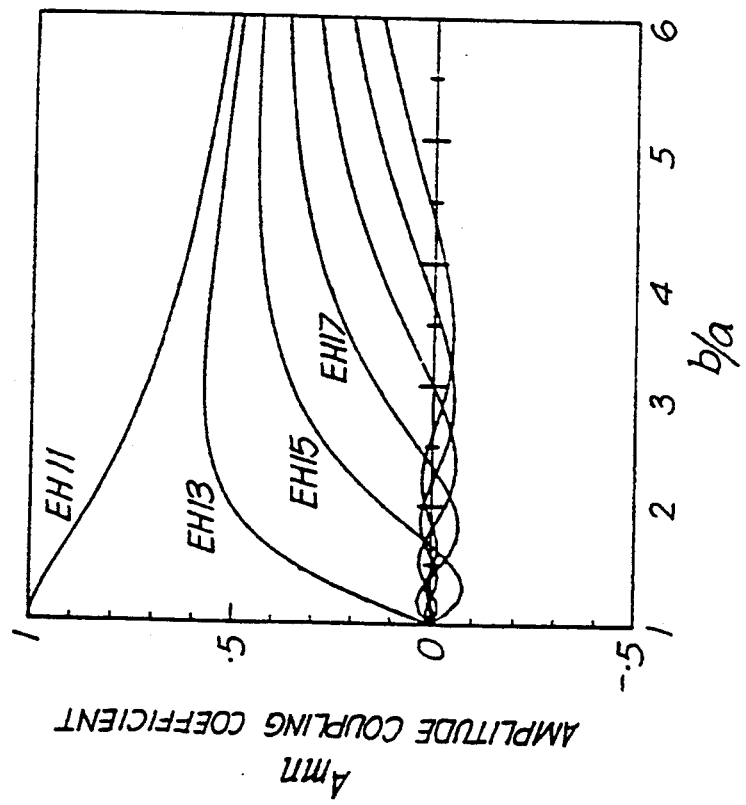

From Equations (2) to (5) it is possible to calculate how the amplitude coefficients of the excited rectangular guide modes vary as a function of b/a, the ratio of the widths of the central and input waveguides. FIG. 4 illustrates the variation of $A_{mn}$ with b/a; ie the effect of varying the central waveguide width to height ratio. FIG. 5 shows the equivalent for $|A_{mn}|^2$, indicating power coupling. FIG. 4 indicates that $A_{mn}=0$ except when m=1 and n is odd. This is because of the symmetric nature of the excitation conditions. Consequently, the modes excited are only the symmetric modes $EH_{11}$, $EH_{13}$, $EH_{15}$ etc.

Figure 6:
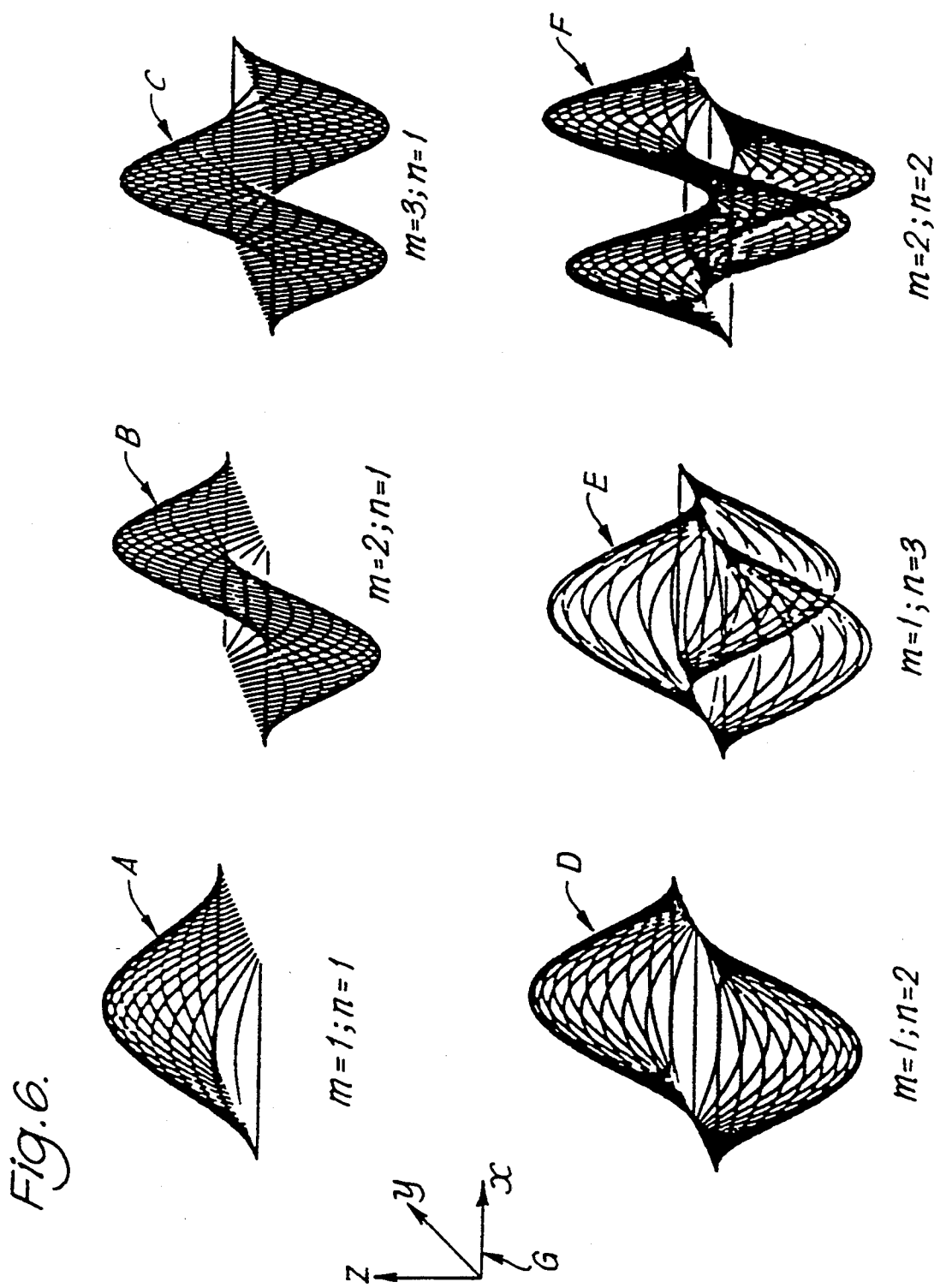
FIG. 6 shows modal amplitude distributions for various lower order waveguide modes.

The forms of some of the lower order $EH_{mn}$ waveguide modes are shown as electric field amplitude distributions in FIG. 6. These were obtained by computation, and are shown as graphs A to F in quasi-three dimensional form. For convenience, the coordinate axes shown at G are rotated with respect to the axes 30 in FIG. 1. The axes x, y and z correspond to transverse vertical, transverse horizontal and longitudinal directions in the multimode waveguide 20 as before. The graphs A to F correspond to modes as follows:

A: $EH_{11}$; B: $EH_{21}$; C: $EH_{31}$;
D: $EH_{12}$; E: $EH_{13}$; F: $EH_{22}$.

Of these, A, C and E are symmetric modes and B, D and F are antisymmetric modes. To clarify this, let E(x) and E(−x) respectively be the electrical field amplitude distributions associated respectively with positive and negative parts of the x axis in FIG. 1; E(x=0) is on the z axis 30. Let E(y) and E(−y) be the equivalents for the y axis.

For a symmetric mode:

$$E(x)=E(-x) \text{ and } E(y)=E(-y) \quad (6.1)$$

For an antisymmetric mode, either one of or both of (6.2) and (6.3) below apply:

$$E(x)=-E(-x) \quad (6.2)$$

$$E(y)=-E(-y) \quad (6.3)$$

In the beamsplitter 10, and in accordance with the invention, the fundamental (symmetric) mode input provides for only symmetric modes of the multimode waveguide to be excited.

The transverse electric field distribution in an xy plane distant z from the input aperture 40 is $E_z$ given by:

$$E_z = \Sigma A_{mn} \cdot EH_{mn} \quad (7)$$

Figure 7:
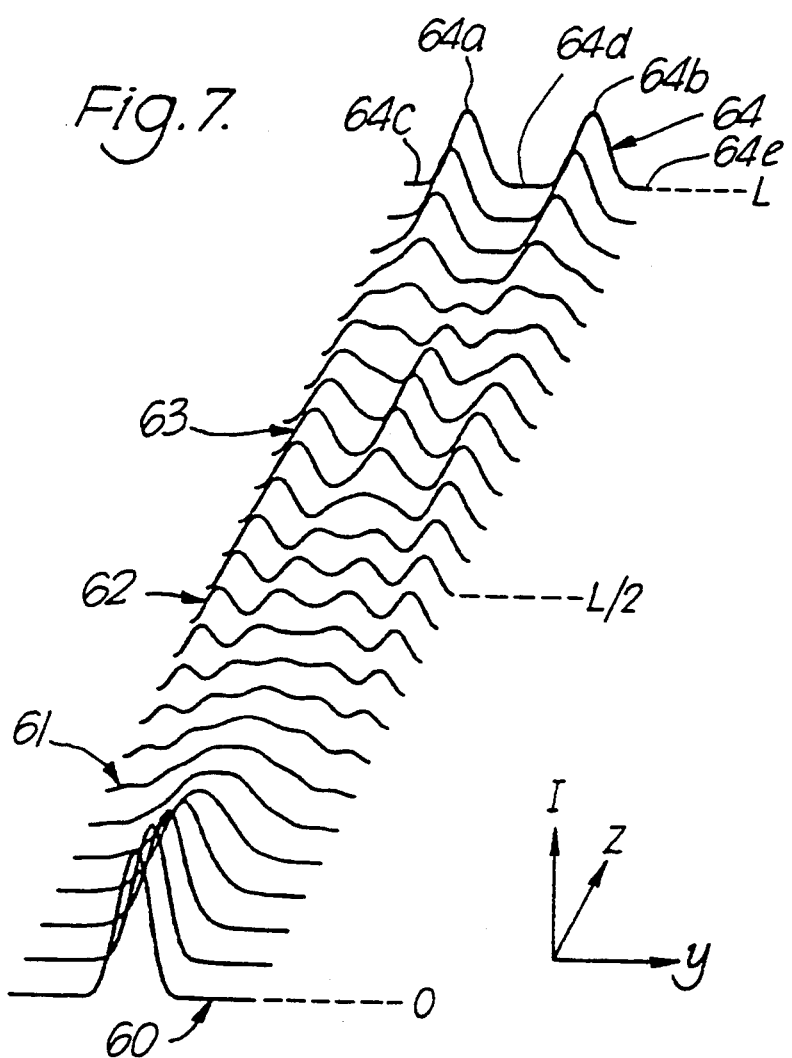
FIGS. 7 and 8 illustrate variation in electric field intensity distribution as a function of position along multimode waveguides of differing cross-section.
Figure 8:
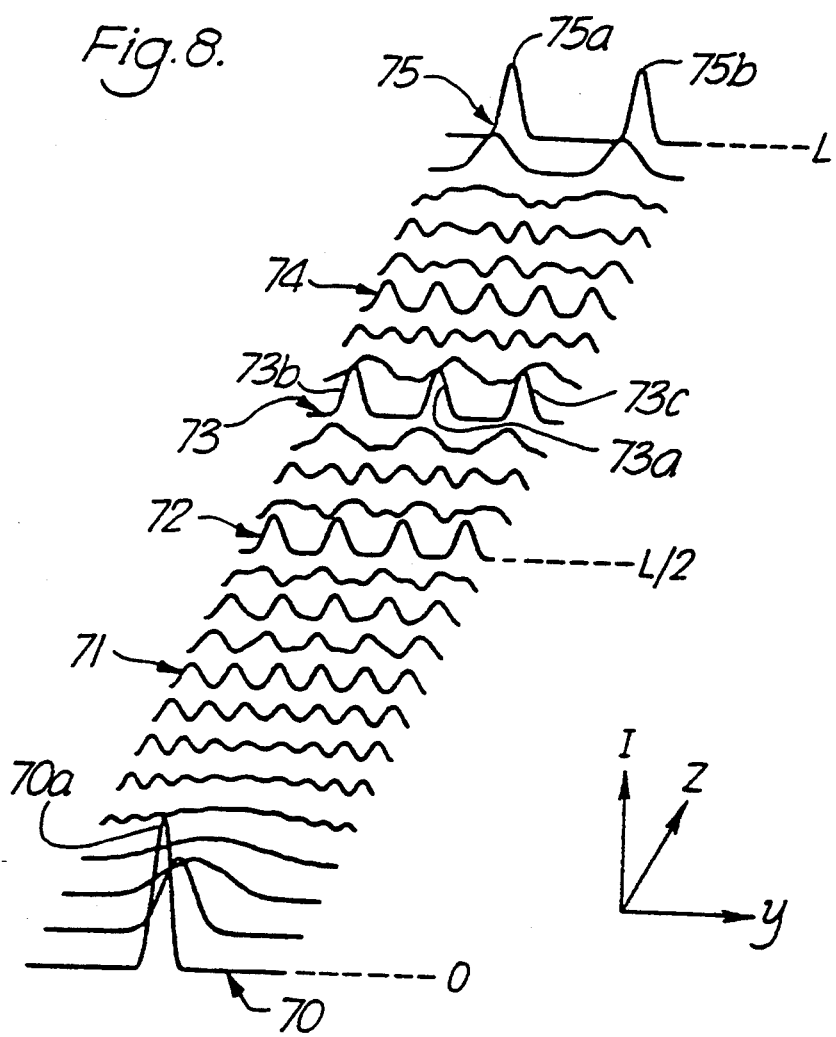

The field intensity distribution in xy planes distant z from the input aperture 40 is $|E_z|^2$, the square of the modulus or magnitude in Equation (7). $|E_z|^2$ has been computed as a function of distance z along the central waveguide 20 for two values of b/a. In both cases, the central waveguide width (2b) was 3 mm, and its height (2a) was 1 mm in one case and 0.5 mm in the other. This corresponds to b/a=3 and b/a=6, and the computation results are given graphically in FIGS. 7 and 8 respectively. FIGS. 7 and 8 give the field intensity $I=|E_z|^2$ as a function of position y across the central waveguide 20 for each of a series of values of z along this waveguide. In both cases the computation was based on a radiation wavelength of 10.59 microns ($CO_2$ laser) and a central waveguide length L of 425 mm given by Equation (1).

As illustrated in FIG. 5, when b/a=3, only the modes $EH_{11}$, $EH_{13}$, $EH_{15}$ and $EH_{17}$ are excited, and these have approximate relative powers 0.52, 0.33, 0.13 and 0.02 respectively. When b/a=6, the modes $EH_{11}$ to $EH_{1,13}$ are excited with respective relative powers from 0.27 to 0.02.

In FIG. 7, an initial central maximum 60 indicates the electric field intensity distribution I at the input waveguide aperture 40 in FIGS. 1 and 2. At this point (z=0), the modes $EH_{11}$ to $EH_{17}$ give rise to electric fields which are in phase with one another and interfere constructively to produce the maximum 60. Moving down the length of the central waveguide 20, ie as z increases, the modes $EH_{11}$ to $EH_{17}$ get out of phase with one another. This is a consequence of Equations (2) and (3), in which the phase coefficient $\beta_{mn}$ and therefore also the propagation constant $\gamma_{mn}$ are dependent on the mode numbers m and n.

The spatial rates of change of these modal electrical field contributions therefore differ along the z axis 30, ie axially of the central waveguide 20. This changes the form of the interference between modal field contributions, and gives rise to a variety of electric field intensity distributions extending transversely. The distributions are indicated by curves such as 61 and 62 in xy planes at respective values of z. Approximately two thirds of the distance down the waveguide 20, the intensity distribution is given by a curve 63 having three similar maxima. At the end of the waveguide 20, the intensity distribution is shown as a curve 64 having two well separated maxima 64a and 64b. The maxima 64a and 64b are located at the centres of the entrance apertures 50 and 52 of the output waveguides 22 and 24. They are in phase with one another, and each excites the fundamental mode of the respective output waveguide 22 or 24 associated with it.

Calculations show that there is efficient coupling of radiation from the input waveguide 18 to the central waveguide 20 as indicated by the curve 60, and from the central waveguide 20 to the output waveguides 22 and 24 as indicated by the curve 64. The curve 64 goes to zero in sections 64c, 64d and 64e corresponding to locations of waveguide end walls 54. In consequence, there is no intensity available for reflection at the end walls 54. Moreover, since the maxima 64a and 64b excite fundamental modes of respective output waveguides 22 and 24, there is no mismatching to generate waves reflected towards the input waveguide 18. Assuming therefore that the attenuation along the waveguides 18 to 24 is insignificant, ie that $\alpha_{nn}$ for m=1 and n=1,3,5 and 7 is negligible, then radiation in the input waveguide 18 is efficiently and equally coupled to both output waveguides 22 and 24. The beamsplitter 10 therefore has good beamsplitting properties when b/a is 3.

Turning now to FIG. 8, this shows transverse electric field distributions along the length of the central waveguide 20 when its cross-sectional aspect ratio b/a is 6, as previously mentioned. As indicated in FIG. 5, the effect of increasing b/a from 3 (as in FIG. 7) to 6 (as in FIG. 8) is to reduce power coupled to central waveguide modes $EH_{11}$ and $EH_{13}$ and increase power coupled to modes $EH_{15}$ to $EH_{1,13}$. Since higher order modes receive more power, the degree of structure and definition in FIG. 8 is increased over that in FIG. 7. In FIG. 8, the field distribution in the plane of the aperture 40 is indicated by a curve 70 with a single maximum 70a. As before, due to the modes $EH_{11}$ to $EH_{1,13}$ having differing $\beta_{mn}$ values, the transverse intensity distributions change with distance z along the central waveguide 20. Curves 71 to 75 indicate locations at which there is field intensity division into multiple maxima of substantially equal form and magnitude. The curves 71, 72, 73, 74 and 75 have six, four, three, five and two maxima respectively. Curve 73 in particular has three well defined maxima 73a, 73b and 73c. The curves 71 to 75 are located at distances from the input waveguide aperture 40 of L/3, L/2, 2L/3, 4L/5 and L respectively, where L is the central waveguide length as has been said. These lengths can be expressed as 2L/6, 2L/4, 2L/3, 4L/5 and 2L/2. Accordingly, there is an inverse relationship between number of maxima and distance.

The central waveguide 20 has output waveguides 22 and 24 positioned receive radiation from maxima 75a and 75b of the curve 75. An alternative device might employ a shorter central waveguide and have a set of output waveguides positioned at respective maxima of one of the curves 71 to 74. This would provide one to N way beamsplitting, where N=6, 4, 3 or 5. it is also possible to have multiple input and output waveguides for M to N way radiation beam splitting. For example, three input waveguides may be positioned with centres at the locations of maxima on curve 73, and five output waveguides may be positioned at the equivalent on curve 74. However, as will be described later, the phases of the electric fields contributed by the input waveguides would be required to differ. Whereas the maxima 70a, 74a and 74b correspond to electric fields which are in phase, in general the maxima on a curve such as 71 are not in phase with one another.

If multiway radiation beam splitting is required, it is necessary to have a sufficiently large value of b/a to avoid unwanted reflections at end walls between output waveguides. A sufficiently high value of b/a ensures that enough symmetric $EH_{mn}$ modes (m=1, n=1,3,5 ...) are excited to produce well defined maxima with intervening zero intensity. This is a matter of design for individual applications. It is however an advantage that the invention requires relatively few modes to be excited. For instance, the electric field pattern illustrated in FIG. 7 with b/a=3 is substantially fully described by the four lowest order odd $EH_{mn}$ modes, that is by $EH_{11}$, $EH_{13}$, $EH_{15}$ and $EH_{17}$. Similarly the electric field pattern of FIG. 8 with b/a=6 is substantially fully described by the seven lowest order odd $EH_{mn}$ modes. Prior art self-imaging guides require fifty or more; in consequence, they require high refractive index core media to preserve total internal reflection at high mode numbers.

Figure 9:
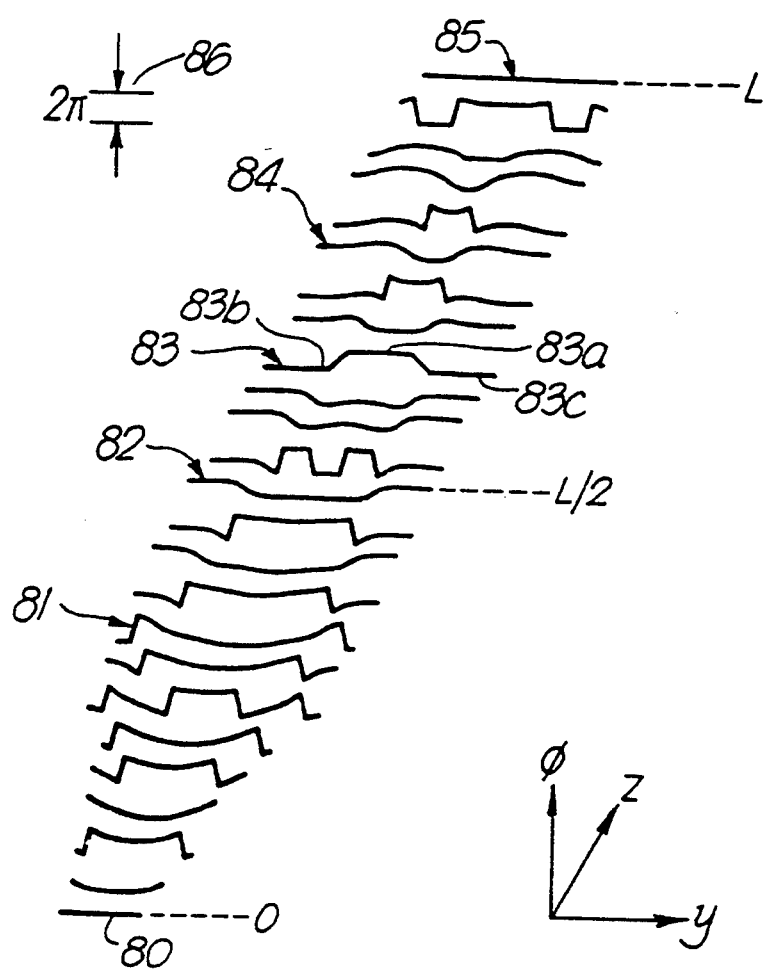
FIG. 9 provides the phase variation along each of the intensity distributions in FIG. 8.

FIG. 9 shows the variation along the y axis of the phase $\phi$ of the resultant electric field for the central waveguide dimensions from which FIG. 8 was derived. Curves such as 80 to 85 are shown, which correspond to curves 70 to 75 respectively. Each of the phase curves such as 81 indicates the phase variation of the electric field across the central waveguide 20 for a respective value of z, and corresponds to a respective intensity distribution in FIG. 8. The vertical scale of the phase representation $\phi$ is shown at 86, where an interval of $2\pi$ is indicated. The field distributions at 70 and 75 are of constant phase as indicated by straight lines 80 and 85. However, curve 83 for example has a central region 83a which differs in phase to its two outer regions 83b and 83c. The regions 83a to 83c give the phases of associated maxima 73a to 73c in FIG. 8. In consequence, the central maximum 73a is out of phase with the outer maxima 73b and 73c, which are in phase with one another. This indicates that a "three to two" beam combined/splitter would require a central maximum 73a shifted phase with respect to outer maxima 73b and 73c in order to generate two In-phase maxima 75a and 75b.

Since curves 80 and 85 are in phase, they produce reversible properties; ie two in-phase inputs 75a and 75b would give rise inter alia to one output 70. Extending this, two central waveguides 20 placed end to end with output waveguide apertures 50 and 52 superimposed would convert maximum 70 to maxima 75a /75b and then back to maximum 70 once more. This can be visualised by considering two versions of FIG. 8 in series with maxima 75a /75b superimposed- The double length of central waveguide thus created is 2L long, which, from Equation (1), is given by:

$$2L = 4b^2/\lambda \tag{7}$$

Equation (7) gives the symmetric mode repeat distance (2L), this being the length of rectangular waveguide over which an initial electric field distribution will be recreated. It assumes the absence of significant attenuation of the relevant symmetric $EH_{mn}$ waveguide modes in the course of propagation of radiation along the waveguide.

The visualisation of two versions of FIG. 8 back to back combined with the like for FIG. 9 illustrates the effects of optical phase. For example, the single maximum 70 and corresponding in-phase curve 80 convert to four maxima 72 with phase variation at a distance L/2. These maxima 72 convert to two in-phase maxima 75a /75b at a distance L/2, and to a single maximum at a distance 3L/2.

FIGS. 7, 8 and 9 relate to specific values of b/a. More generally, for the beamsplitter 10 of FIGS. 1 to 3, only modes $EH_{1n}$ are excited because of the $EH_{11}$ symmetry of the excitation from the input waveguide 18. At the input waveguide aperture 40, the phase is constant. For the case involving arbitrary b/a values, using Equation (3) the phase coefficient $\beta_{1p}$ of mode $EH_{1p}$ is given by:

$$\beta_{1p} = \frac{2\pi}{\lambda}\left[1 - \frac{1}{2}\left\{\left(\frac{\lambda}{4a}\right)^2 + \left(\frac{\lambda p}{4b}\right)^2\right\}\right] \tag{8}$$

and the phase coefficient $\beta_{1q}$ of mode $EH_{1q}$ is given by:

$$\beta_{1q} = \frac{2\pi}{\lambda}\left[1 - \frac{1}{2}\left\{\left(\frac{\lambda}{4a}\right)^2 + \left(\frac{\lambda q}{4b}\right)^2\right\}\right] \tag{9}$$

By subtraction of Equation (9) from Equation (8) and rearranging, the phase difference between modes $EH_{1p}$ and $EH_{1g}$ at guide length z is $X_z$ given by:

$$\chi_z = \beta_{1p} - \beta_{1q} = \frac{\pi \cdot \lambda \cdot z}{16 \cdot b^2} \cdot (p^2 - q^2) \qquad (10)$$

If the condition is imposed that a $2\pi$ phase difference exist between the modes, Equation (10) becomes:

$$\chi_z = \frac{\pi \cdot \lambda \cdot z}{16 \cdot b^2} \cdot (p^2 - q^2) = 2\pi \qquad (11)$$

and the propagation distance z (say $z_{2\pi}$) in Equation (11) in rectangular waveguide that gives rise to a $2\pi$ phase difference between modes $EH_{1p}$ and $EH_{1q}$ is given by:

$$z_{2\pi} = \frac{32 \cdot b^2}{(p^2 - q^2) \cdot \lambda} \qquad (12)$$

For the case of the $EH_{11}$ and $EH_{1n}$ modes (i.e the fundamental and $n^{th}$ highest order odd mode) $z_{2\pi}$ is given by $$z_{2\pi} = \frac{32 \cdot b^2}{(n^2 - 1) \cdot \lambda} \qquad (13)$$

Combining Equations (2) and (13):

$$z_{2\pi} = \frac{16L}{(n^2 - 1)} \qquad (14)$$

With n=3,5,7,9,11 ... $16L/n^2-1)$ $z_{2\pi}$ is 2L, 2L/3, L/3, L/5, 2L/15 ... As fractions of a propagation distance 2L in rectangular waveguide which results in the $EH_{11}$ and $EH_{13}$ modes being back in phase, the relative length ratios are 1, ⅓, 1/6, 1/10, 1/15 etc. This shows that there is a harmonic relationship between the $EH_{1n}$ modes of the rectangular guide. Equation (4) shows that the propagation distance $z_{2\pi}$ which gives rise to a $2\pi$ phase shift between the fundamental $EH_{11}$ mode and the next highest order $EH_{13}$ mode also gives rise to a $2\pi$ phase shift between the fundamental and all other $EH_{1n}$ modes (n odd). This results in reproduction of any symmetric input electric field after a distance $z_{2\pi}$, provided that there is only excitation of odd $EH_{1n}$ modes. A symmetric input field is also produced periodically at distances of $tz_{2\pi}$, where "t" is an integer number if there is sufficient length of rectangular waveguide available.

Equations (11) to (14) may be rewritten to determine $z_\pi$, the propagation distance in rectangular waveguide over which an intermode phase change of $\pi$ is introduced. By inspection of these equations, it is seen that:

$$z_\pi = \tfrac{1}{2} z_{2\pi} = 8L/(n^2 - 1) \qquad (15)$$

L and 2L are the waveguide lengths over which $z_\pi$ and $z_{2\pi}$ are introduced, and $L=2b^2/\lambda$ from Equation (1). In consequence, $z_\pi$ and $z_{2\pi}$ are both proportional to $b^2$, and may be arranged to occur at prearranged distances along a rectangular waveguide by suitable choice of the waveguide width.

The foregoing analysis was verified experimentally as follows. A hollow rectangular alumina waveguide was employed with dimensions 1.5 mm (width 2b) by 0.6 mm (height 2a) by 212 mm length (2L). This length is $4b^2/\lambda$ for a $CO_2$ laser wavelength of 10.59 microns. The waveguide represented the central waveguide 20 of FIG. 1. Input to the waveguide was furnished by focusing a $CO_2$ laser beam to a waist of 0.42 mm on the longitudinal waveguide axis (axis 30 in FIG. 1), the beam being directed along this axis. Such an input provided an excitation similar to that from an input waveguide 18. It was a good approximation to a fundamental mode input from a waveguide of square section with 0.6 mm sides and coaxial location. A pyroelectric vidicon camera was used to detect output from the rectangular waveguide. The camera confirmed that radiation output from the waveguide was equivalent in intensity distribution to radiation input translated by 212 mm, the waveguide length; i.e the input had been recreated with an axial displacement equal to 2L or $4b^2/\lambda$. The overall transmission of intensity was 82% of that input. This indicated a high transmission efficiency by the waveguide, since the losses of 18% were small and at least partly attributable to coupling inefficiency because input and output waveguides were not employed. The measurements verified that an input electric field distribution would be recreated by a rectangular waveguide at a propagation distance $4b^2/\lambda$, where b was the waveguide width dimension responsible for multimode effects.

The foregoing arrangement was also employed to test beam splitting effects. To achieve this, two hollow core optical fibres (0.53 mm internal diameter) were inserted into the rectangular waveguide, the fibres having input ends positioned in the guide mid-length cross-sectional plane. The fibre input ends were consequently distant $L=2b^2/\lambda=106$ mm from the input $CO_2$ laser beamwaist. The fibre centres at these inputs were positioned midway between the waveguide central axis and respective waveguide side walls. The fibres therefore simulated square waveguides 22 and 24 connected via a rectangular central waveguide of length L to an input electric field distribution provided by the laser beam waist.

The pyroelectric ridicon camera was employed to detect output from the fibres. It demonstrated that the fibre outputs were equal in amplitude and in intensity distribution, which was circularly symmetric in both cases. This proved that an even amplitude fundamental mode splitting of the input radiation had occurred in a length $L=2b^2/\lambda$ of rectangular waveguide. The fibres were also placed side by side to produce overlap between their outputs. This created well defined interference fringes. waveguide and fibres, it was calculated that the process of beamsplitting was 75% efficient. The 25% loss was attributed to fibre mlsalignment and incorrect sizing, together with imperfect input field distribution. Despite this, the beamsplitting effect was demonstrated at waveguide length L to add to the earlier demonstration of input reconstitution at waveguide length 2L.

The beamsplitting device 10 may be constructed of materials other than alumina, eg BeO, Si, Macor or metal.

The foregoing description with reference to FIGS. 1 to 9 demonstrates that beamsplitting is achievable in the width dimension of a rectangular waveguide. For example, in FIG. 8 the maxima 75a and 75b are spaced apart along the y axis across the waveguide width. If the central waveguide is constructed with a height sufficiently greater than 2a, then it will have a multimode structure in the x dimension in addition to that previously described. In particular, a central square cross-section waveguide of height and width 2b=4a and length L will convert an input waveguide fundamental EH$_{11}$ mode on-axis at one end to four in-phase fundamental mode outputs at the other end. These outputs will be centred at points in the x, y plane at z=L given by (b/2, b/2), (b/2, −b/2), (−b/2, −b/2) and (−b/2, b/2); here x=y=0 is on the longitudinal symmetry axis of the waveguide (equivalent to axis 30 in FIGS. 1 to 3). In this instance, two dimensional waveguide modes EH$_{mn}$ (m,n,=1,3,5 . . . ) are excited instead of only the one dimensional equivalent (m=1, n=1,3,5 . . . ) of FIGS. 1 to 9. Consideration of two versions of FIG. 8 at right angles to one another indicates that more complex splitting is possible with appropriate location of inputs and outputs and phase control as per FIG. 9.

The foregoing remarks regarding square waveguides are extendable to rectangular waveguides. As previously stated, beam division into K intensity maxima in a waveguide width dimension of width 2b occurs an a distance L$_K$ given by:

$$L_K = 4b^2/\lambda K \qquad (17)$$

If the waveguide has an orthogonal width dimension of width 2a in which splitting into J intensity maxima is required, this will occur at a length L$_J$ given by:

$$L_J = 4a^2/\lambda J \qquad (18)$$

If simultaneous splitting into J and K intensity maxima is required in the same length of waveguide, the waveguide cross-section dimensions b/a will be given by equating L$_J$ and L$_K$ and taking the square root as follows:

$$b/a = \sqrt{(K/J)} \qquad (19)$$

In consequence, splitting into a nine by four array of intensity maxima will occur in a rectangular waveguide with b equal to 3a/2 at a distance of a$^2$/k.

In embodiments of the invention it is preferable that the multimode waveguide (eg 20) should be either square or rectangular. The x and y axes are defined as passing through the centre of this guide (x=y=0) and as parallel to the waveguide walls 25 and 42 respectively as shown in FIGS. 1 and 2. Symmetric mode fields in the multimode waveguide should have reflection symmetry in the two mirror planes x=0 and y=0, i.e E(x,y,z)=E(−x,y,z)=E(x,−y,z). The input and output electric fields should have the same type of symmetry, and so the following types of input guides may be used: 1) square or rectangular guides with sides parallel to the x and y axes, 2) circular guides or optical fibres. These are the important types of guides, but square guides with sides at 45° to the x and y axes might also be used, or elliptical guides with the major and minor axes parallel to the x and y axes. Diamond shaped or octagonal guides might also be used, or any other types of guides which satisfy the symmetry conditions.

The output waveguides should have the same shape and orientation at the multimode waveguide's output surface as the input guide has at the input surface. This ensures that the images of the input mode at the output end of the multimode waveguide are correctly matched to the output waveguides. The output electric field will have the same type of symmetry as the input electric field. Consequently, if one output waveguide is at x=x$_o$ and y =y$_o$, there should be other output waveguides at (−x$_o$, y$_o$), (x$_o$, −y$_o$) and (−x$_o$, −y$_o$). Lacking one or more such guides, absorbing means might be employed to remove unwanted radiation.

If all of the waveguides in a device of the invention are single moded in one direction (y for example), as for semiconductor material waveguides to be described later, it is important that the mode shape in that direction is the same for all waveguides. The mode shape does not however have to be sinusoidal in this direction. Consequently, in a device of the invention formed of semiconductor material layers, the waveguides may consist of different epitaxial layers of GaAs and AlA-GaAs with their thickness dimensions parallel to the desired single mode direction.

These criteria are however subject to the proviso that the invention is not very sensitive to minor departures from accurate engineering.

Figure 10:
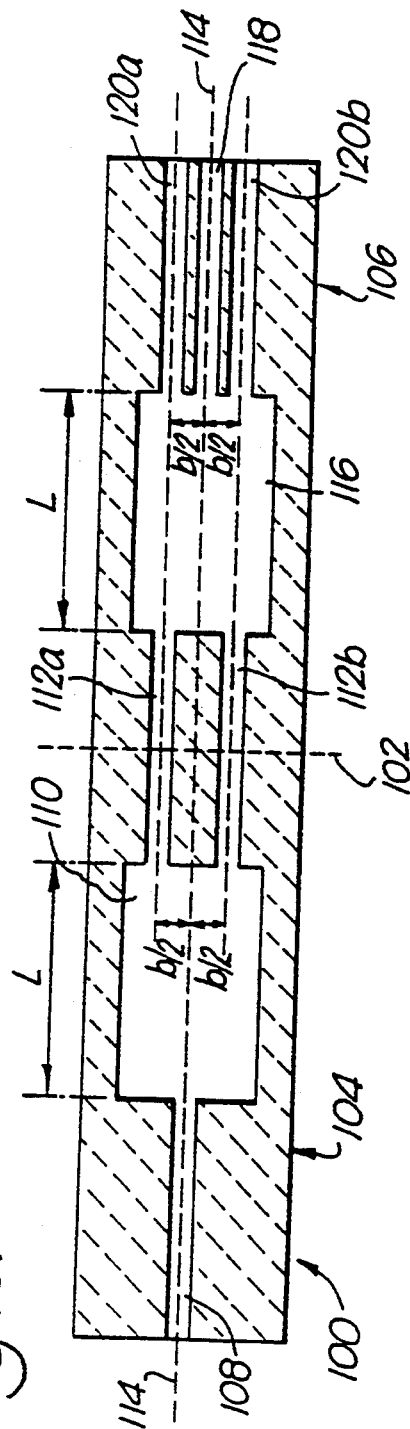
FIG. 10 is a plan view of an optical device of the invention configured as a Mach Zehnder interferometer.

Referring to FIGS. 1, 2 and 3 once more, the beamsplitter 10 is a transmissive device with input and output waveguides 18 and 22/24 at mutually opposite longitudinal ends. A related folded light path device may be constructed by incorporating a reflector into an equivalent of the multimode waveguide 20. The reflected light path may be at any angle to the unreflected path. Retroreflection may be arranged so that light input at one longitudinal end of a multimode waveguide is returned to it. Input and output waveguides (equivalent to waveguides 18 and 22, 24) are then at the same longitudinal end of that multimode waveguide. In this case the required length of multimode waveguide is L/2, since light passes through it in both forward and return directions. Referring now to FIG. 10, there is shown a further embodiment of the invention in the form of a Mach-Zehnder interferometer 100. The interferometer 100 is equivalent to two of the devices 10 of FIG. 1 connected in series back to back, and with the addition of subsidiary features. A chain line 102 indicates a notional division of the interferometer 100 into halves which are close to mirror images of one another. The halves comprise a beam divider 104 and a beam combined 106. The beam divider 104 incorporates an input square section waveguide 108 connected coaxially to a first rectangular waveguide 110 of dimensions 2a by 2b by L. Here L is 2b$^2$/λ as before. The rectangular waveguide 110 is connected to two interferometer arm waveguides 112a and 112b axially parallel to but offset by b/2 either side of an interferometer axis 114. The interferometer arm waveguides 112a and 112b have like dimensions to those of the input waveguide 108.

The interferometer arm waveguides are connected to a second, or subsidiary, rectangular waveguide 116 arranged coaxially with and dimensioned as the first such waveguide 110. The subsidiary waveguide 116 is connected to a central output waveguide 118 and to two offset output waveguides 120a and 120b. The central output waveguide 118 is coaxial with the interferometer axis 114. The offset output waveguides 120a and 120b are axially spaced from the axis 114 by b/2, and are coaxial with the interferometer arm waveguides 112a and 112b respectively. In order that there be a finite wall thickness between the central output waveguide 118 and each of the offset waveguides 120a and 120b, geometry dictates that b must be greater than 4a. The input waveguide 108, the interferometer arm waveguides 112a and 112b, and the output waveguides 118 and 120 are all of length L. Their length is not however critical since they are operating in fundamental mode only.

The interferometer 100 operates as follows. The beam divider 104 functions as the beamsplitter 10. It divides a fundamental mode radiation input from the waveguide 108 into two equal intensity, in phase fundamental mode beams in the interferometer arm waveguides 112a and 112b.

As illustrated, the interferometer arm waveguides 112a and 112b are identical. They consequently provide in-phase inputs to the subsidiary rectangular waveguide 116. The latter acts in reverse compared to the first such waveguide 110, and recombines the in-phase inputs into a single beam in fundamental mode input to the central output waveguide 118. This function is equivalent to FIG. 8 in reverse. It illustrates the reversibility of devices of the invention. No significant radiation intensity reaches the offset output waveguides 120a and 120b.

If however a phase change is introduced into radiation propagating in one of the interferometer arm waveguides 112a and 112b relative to that in the other, then the intensity in the central output waveguide 118 is reduced.

As has been said, the interferometer 100 is equivalent to two devices 104 and 106 of the invention back to back. Of these, the beam divider 104 operates as the device 10 described earlier, and the beam recombiner 106 operates in reverse and includes additional waveguides 112a and 112b. The beam recombiner 106 consequently demonstrates that devices of the invention may be operated in reverse and may include additional output waveguides to accept radiation arising from inputs of differing phase characteristics.

Figure 12:
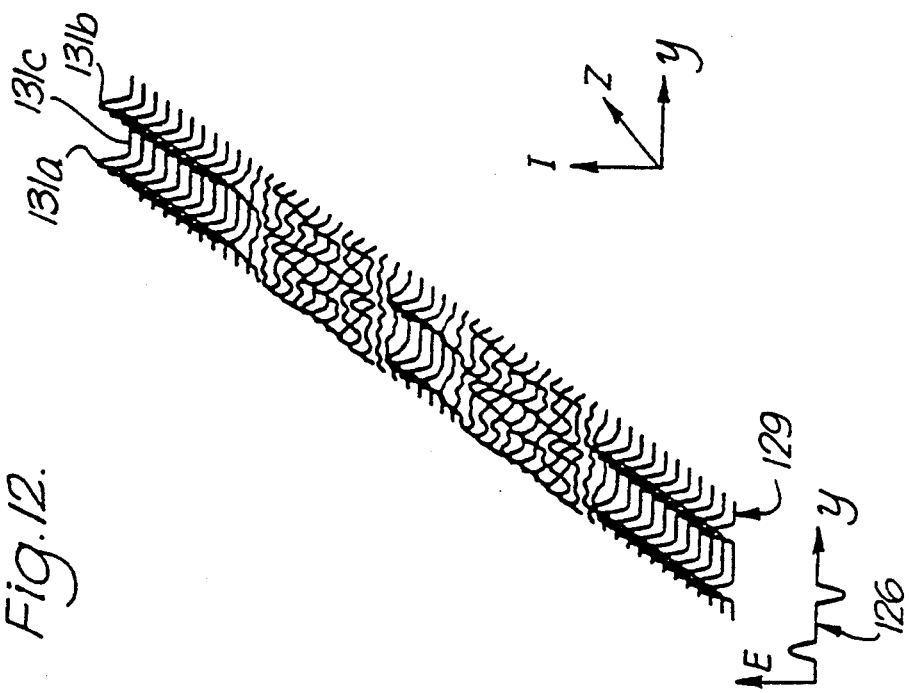
FIGS. 11 and 12 provide electric field intensity distributions in part of the interferometer of FIG. 10 for different input phase conditions.
Figure 11:
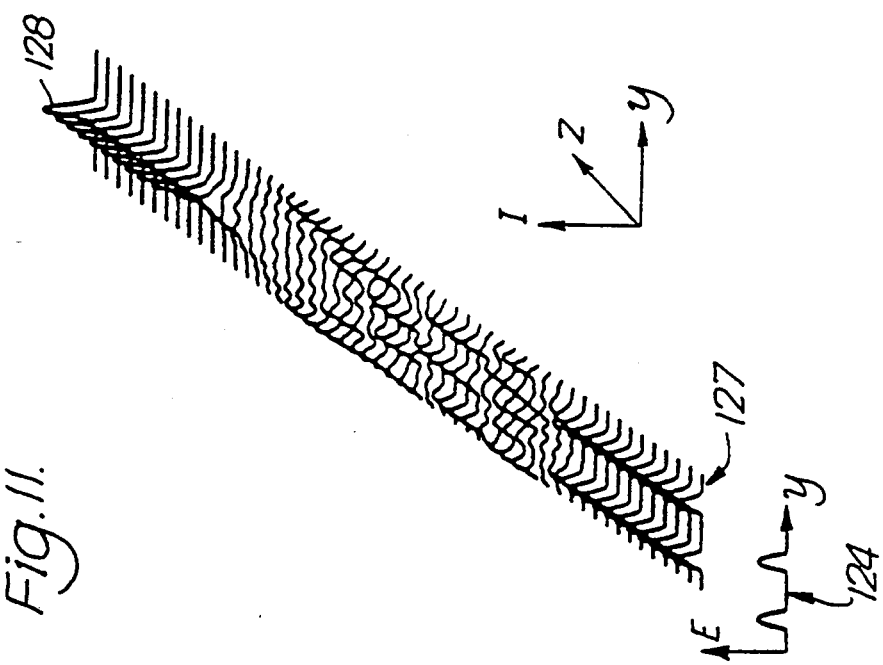

FIGS. 11 and 12 are families of electric field intensity distributions for the subsidiary rectangular waveguide 116. They respectively illustrate the situations in the subsidiary waveguide 116 for in-phase inputs indicated by twin electric field amplitude maxima at 124 and for antiphase inputs indicated by a maximum and a minimum in this quantity at 126.

FIG. 11 is equivalent to FIG. 8 reversed. In-phase input intensity maxima 127 excite only symmetric or odd modes in the subsidiary waveguide t16 and give rise to a single central output maximum 128. FIG. 12 however demonstrates that a $\pi$ phase difference between the inputs 129 to the second waveguide 116 results in twin output radiation intensity maxima 131a and 131b. The maxima 131a and 131b are centred on the offset output waveguides 120a and 120b respectively, and the radiation intensity 131c at the central output waveguide 118 is zero.

In general, any phase difference (not only $\pi$) between the inputs to the subsidiary rectangular waveguide 116 will lead to the excitation of even as well as odd modes and change the magnitude of the intensity in the central output waveguide 118. Modulation of the phase difference modulates this intensity. The modulation may be achieved by incorporation of an electro-optic modulator or a discharge cell into one of the interferometer arm waveguides 112a and 112b. Alternatively, a fluid cell could be incorporated in one of the interferometer arm waveguides to allow detection of small changes in liquid or gas refractive index. In either case, the other arm waveguide would have a compensating increase in optical path to produce equal phase inputs to the subsidiary rectangular waveguide 116 in the absence of phase change to be measured.

Referring now to FIG. 13, there is shown a perspective view of a further embodiment of the invention. It is in the form of a beamsplitter indicated generally by 140.

The beamsplitter 140 differs from earlier embodiments in that it employs solid waveguides. It incorporates a multimode central waveguide 142 with a central longitudinal axis 144. A single input waveguide 146 is connected to one end wall 142a of the multimode waveguide 142 and is coaxial with the latter. Four output waveguides 148a to 148d extend from the other end wall 142b of the multimode waveguide 142, the output waveguides having respective central axes 150a to 150d. The multimode waveguide 142 may be considered as longitudinally divided into quarters 152a to 152d by vertical planes through the central axis 144 and two further axes 154a and 154b parallel to the former and either side of it. The output waveguides are located so that their axes 150a to 150d are central to respective multimode waveguide quarters 152a to 152d. More generally, in the case of a beamsplitter having N output waveguides, the output waveguide axes would each be central to a respective longitudinal subdivision of the associated multimode waveguide, there being N equal subdivisions. These axes are therefore located periodically across the multimode waveguide's transverse cross-section.

The multimode waveguide 142 is 468 $\mu$m long and 24 $\mu$m wide, and its quarters 152a to 152d are consequently 6 $\mu$m wide. Its transverse cross-section is constant. The input and output waveguides 146 and 148a to 148d are 2 $\mu$m wide; the latter have 6 $\mu$m spacing between adjacent pairs of axes 150a /150b etc and 3 $\mu$m spacing between outermost axes 150a and 150d and respective multimode waveguide sidewalls 142c and 142d.

The input waveguide 146 receives input light as shown by an arrow 156. The output waveguides 148a to 148d have end faces 160a to 160d at which light emerges, as indicated by arrows such as 162. A chain line 164 indicates a position at which the beamsplitter 142 may be cleaved to permit optical measurements at the end wall 142b.

The beamsplitter 140 has a layer structure shown on an expanded scale in FIG. 14, in which an output waveguide end face 160 is shown. The beamsplitter incorporates a substrate wafer 170 of semi-insulating GaAs of the kind normally used in epitaxially-grown devices. The substrate wafer 170 bears the following upwardly successive layers:

(a) a GaAs buffer layer 172 0.1 $\mu$m thick;
(b) an $Al_{0.1}Ga_{0.9}As$ lower cladding layer 174 2.5 $\mu$m thick (refractive index n=3.420);
(c) a GaAs waveguide core layer 176 1.0 $\mu$m thick (n=3.479);
(d) an $Al_{0.1}Ga_{0.9}As$ upper cladding layer 178 1.0 $\mu$m thick (n=3.420); and
(e) a GaAs capping layer 180 0.1 $\mu$m thick.

In the vertical direction, i.e along the thickness dimension of the layers 172 to 180, the input, output and multimode waveguides 146, 148a to 148d and 142 are monomode. Because the input and output waveguides 146 and 148a to 148d are only 2 $\mu$m wide, for Nd-YAG laser radiation they are also monomode in the width dimension orthogonal to the layer thickness. The multimode waveguide 142 however supports a plurality of modes in this second transverse direction by virtue of its 24 $\mu$m width.

Light is confined to the core layer 176 by the cladding layers 174 and 178. This region only supports the fundamental mode of propagation in the vertical direction for Nd-YAG laser radiation. The effective refractive index $n_e$ of the combination of the waveguide layers 174/176/178 is intermediate the core and cladding indices, and is 3.455. The Nd-YAG laser wavelength in the beamsplitter 140 is therefore the free space value of 1.064 μm ($\lambda_o$) divided by 3.455 ($n_e$).

The multimode waveguide length is 468 μm. This is equal to L/2, where L is given by Equation (1) as $2b^2/\lambda$. Here 2b is the multimode waveguide width of 24 μm and $\lambda$ is the Nd-YAG laser wavelength in the waveguides 142, 146 and 148a to 148d. L/2 corresponds to the curve 72 in FIG. 8, where a fundamental mode input represented by the curve 70 is converted to four fundamental mode excitations for appropriately located output waveguides 148a to 148d. Evaluating L/2 gives:

$$L/2 = \frac{1}{2} \cdot 2b^2/\lambda = 144 \times \frac{3.455}{1.064} = 468 \ \mu m \quad (16)$$

which is as in FIG. 12.

A process for constructing the beamsplitter 140 is as follows. The layers 172 to 180 are deposited in succession on the substrate 170 by known epitaxial techniques without specific provision for doping. This leaves background doping in the region $10^{14}/cm^3$ to $10^{16}/cm^3$.

After layer deposition, a layer of photoresist is spun on to the capping layer 180. A mask defining the outline of the beamsplitter 140 is placed over the photoresist, and ultraviolet light is used to illuminate the photoresist through the mask. The photoresist is then developed, and UV-exposed regions are removed chemically to uncover semiconductor material for removal. The substrate wafer is then placed in a reactive ion etching machine and etched for one hour. This produces an etch depth of 2.5 μm, which consequently extends entirely through the capping, upper cladding and core layers 178 to 176 and 0.4 μm into the lower cladding layer 174. This defines upstanding or ridge waveguides such as waveguides 142, 146 and 148a to 148d.

Whereas the foregoing procedure relates to the ternary semiconductor material system $Al_xGa_{1-x}As$, it is also possible to employ other ternary and quaternary semiconductor material systems. For example, InGaAsP may be employed.

Figure 15:
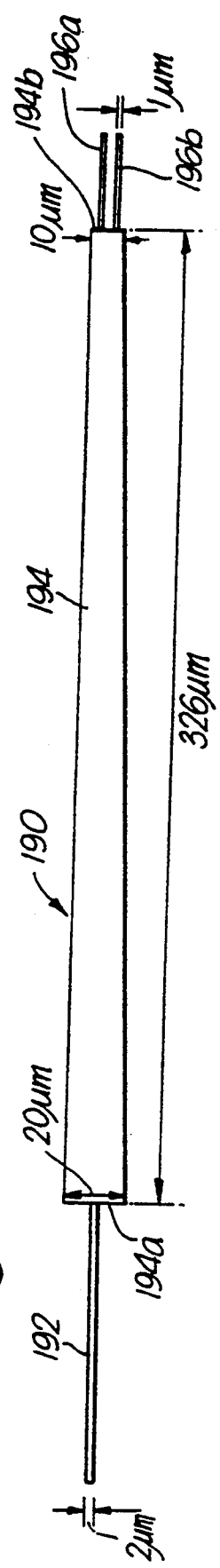
FIG. 15 illustrates a beamsplitter of the invention incorporating a tapered multimode waveguide.

The embodiment shown in FIGS. 13 and 14 was not constructed. A photolithography mask was instead produced which bore a variety of beamsplitter patterns. It provided for the production of wafers bearing many different forms of beamsplitter for testing. Among these were devices incorporating tapered multimode waveguides. One such is illustrated in FIG. 15 and is indicated generally by 190.

The tapered beamsplitter 190 has a layer structure as previously described for the beamsplitter 140; i.e their constructions in the vertical or thickness direction are equivalent. The tapered beamsplitter 190 Incorporates an input waveguide 192 2 μm wide and a multimode waveguide 194 326 μm long tapering linearly from 20 μm to 10 μm in width between ends 194a and 194b. Two output waveguides 196a and 196b extend from the narrower end 194b, these being 1 μm in width.

It can be shown that the effect of tapering the multimode waveguide 194 is to change the length required to obtain a given splitting by a multiplicative factor M. M is the ratio of the width of the output end 194b to that of the input end 194a, and is 0.5 in the present example. In particular, the length L in Equation (1) required to produce one to two way splitting becomes:

$$L = 2Mb^2/\lambda \quad (17)$$

where b is the half width of the multimode waveguide input end 194a. For the beamsplitter 190:

$$L = 2 \times 0.5 \times 100 \times 3.455/1.064 = 325 \ \mu m \quad (18)$$

Equations (17) and (18) demonstrate that tapering a multimode waveguide alters the length required to obtain a given degree of beamsplitting. The parameter M may be greater than unity, corresponding to a multimode waveguide which increases in width from input to output. This however increases the length required for a given degree of beamsplitting. The taper may be linear as shown in FIG. 15, or it may be non-linear. In the latter case equation (17) does not apply. The degree of taper must be such as to provide for radiation within the multimode waveguide to be incident on its walls at angles greater than the critical angle. This is satisfied for low mode numbers by any straight or longitudinally widening waveguide, or by the waveguide 194 which narrows relatively slowly along its length. In a GaAs waveguide bounded by air, a reducing taper angle should be less than 5° measured between waveguide wall and central axis. Strictly speaking, the output end of a tapered multimode guide should be curved, but for small taper angles less than 5° it is not essential.

Whereas Equation (17) refers to a single taper, it is also possible to design a multimode waveguide with multiple successive tapers. These may be in the same sense, ie reducing or increasing, or of opposite senses.

Figure 16:
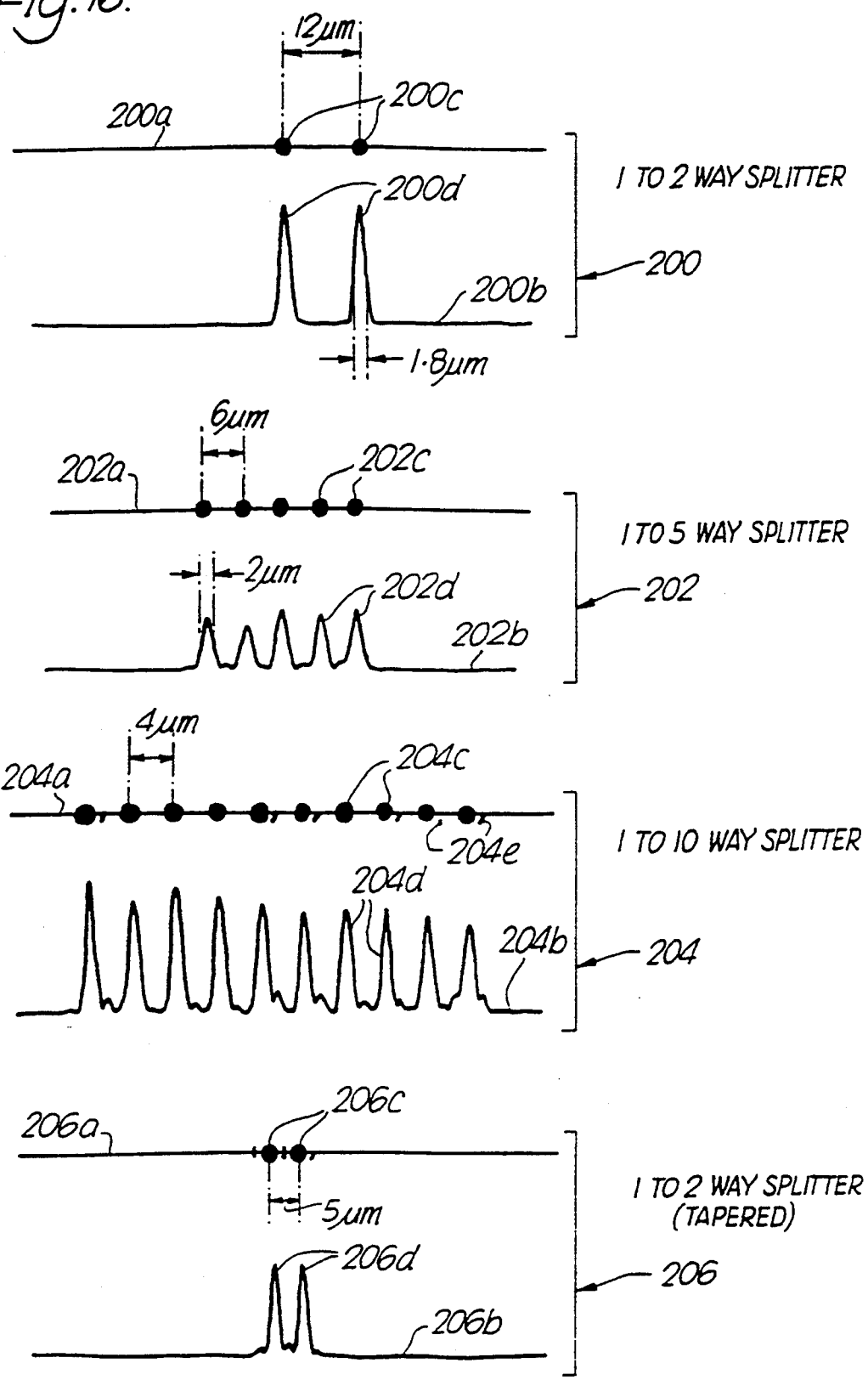
FIG. 16 shows results obtained with beamsplitters similar to those of FIGS. 13 to 15.

Referring now to FIG. 16, there are shown results obtained from testing beam splitters of various types made as described with reference to FIGS. 13 to 15. These results were obtained from three non-tapered devices arranged respectively for 1 to 2 way, 1 to 5 way and 1 to 10 way beamsplitting, together with one tapered device with dimensions as illustrated in FIG. 15. The 1 to 2 way device had a multimode central waveguide 936 μm long and 24 μm wide, and input and output waveguides 2 μm wide. The equivalents for the 1 to 5 way and 1 to 10 way devices were 30 μm × 586 μm and 40 μm × 521 μm respectively.

The effectiveness of each test beamsplitter was determined as follows. They were cleaved at respective multimode waveguide output ends, these being positions equivalent to line 164 in FIG. 13. This enabled the intensity distributions at ends of multimode waveguides to be measured, i.e at positions corresponding to entrance apertures of output waveguides.

Each input waveguide was illuminated with light from an Nd-YAG laser. The laser output was focussed to a diffraction-limited spot 1 μm in diameter by means of microscope objective lenses, and this spot was applied to each input waveguide end face in turn. Intensity patterns appearing at respective cleaved faces were measured with an infrared camera.

FIG. 16 displays results in two forms for each of the test beamsplitters. There are consequently four groups of results indicated generally by 200, 202, 204 and 206. Upper lines 200a to 206a of the groups represent the infrared camera images in each case. Lower graphs 200b to 206b represent intensity variation with distance across the respective multimode waveguide output face in each case. The lines 200a etc bear dots such as 200c to 206c indicating spots of light. The horizontal scales differ between groups, as indicated by the spacings given between spots such as 200c. The graphs 200b etc have maxima such as 200d indicating the intensity variation through associated light spots immediately above.

The result group 200 relates to the 1 to 2 way non-tapered beamsplitter. The spots 200c have centres 12 μm apart. The associated maxima 200d have a full width at half maximum (FWHM) of 1.8 μm, which is slightly less than the width (2 μm) of the associated output waveguides on which the spots 200c are centred. The maxima 200d are virtually identical, indicating high quality, equal intensity beamsplitting. Moreover, the graph 200b goes to zero between these maxima; this indicates ideal beamsplitting characteristics.

Groups 202 and 204 show similar results for the 1 to 5 and 1 to 10 way devices. These show maxima 202d and 204d with an intensity spread of ±15% and ±20% respectively. However, division into the correct number of output beams was obtained, together with the required regular spacing and good matching to the output waveguide width and fundamental mode in each case. The 1 to 10 way device exhibits minor unwanted light spots such as 204e. This indicates that light intensity in regions between adjacent maxima is not quite zero.

The effects of spread in intensities at maxima 202d and 204d and unwanted light such as 204e is attributed to the following:
(a) reflection at cleaved faces equivalent to 164, where a GaAs:air interface occurs, and
(b) limited resolving power and field of view of the camera used to obtain results.

The result group 206 for the tapered beamsplitter shows the correct number of maxima (two) 206d with the required 5 μm spacing.

In implementations of the semiconductor beamsplitters in integrated optical circuits, limitations (a) and (b) above would not apply.

The foregoing description with reference to FIGS. 1 to 16 has dealt in detail with cases involving input, multimode and output waveguides where:
(a) the input waveguide is straight and coaxial with the multimode waveguides,
(b) the multimode waveguide is multimode in one transverse dimension orthogonal to the waveguide thickness and monomode in the thickness dimension, and
(c) the output waveguide axes are parallel to and coplanar with that of the multimode and input waveguides.

Conditions (a) to (c) above are not essential. The input waveguide axis may be curved, provided that light in this waveguide excites only symmetric modes of the multimode waveguide. The multimode waveguide may be multimode in both transverse dimensions. For example, as has been mentioned, a square input waveguide may be connected coaxially to a square multimode waveguide. This will produce two-way splitting in both transverse dimensions. It would form the basis for a fibre optic multiway connector. The connector, a multimode waveguide, would have an input port at one end accepting an input fibre and multiple output ports for respective receive fibres.

The waveguide axes need not be parallel. The output waveguides may be curved provided that the fundamental radiation mode they support experiences total internal reflection at waveguide walls. However, it is necessary for the radiation amplitude distribution to be of constant phase across the aperture or input port where the input waveguide merges into the multimode waveguide. The input port of the beamsplitter 10 is the aperture 40 in FIG. 2. This criterion is satisfied by an input waveguide operating in fundamental mode only and which is axially parallel to the multimode waveguide where they merge at the input port.

Referring now to FIG. 17, there is shown a schematic perspective view of a further form of beamsplitter of the invention indicated generally by 220. The beamsplitter 220 incorporates a fundamental mode input hollow waveguide 222 of internal square cross-section with side 2a. It has a multimode waveguide 224 of length n and also of internally square cross-section, but with sides 2b in extent. The input and multimode waveguides 222 and 224 are coaxial. The beamsplitter 220 also incorporates four fundamental mode hollow output waveguides 226a to 226d, these being axially parallel to the input and multimode waveguides 222 and 224. They have the same internal cross-section as the input waveguide 222, i.e side 2a.

FIG. 18 is a section on lines XVIII—XVIII in FIG. 17 looking in the direction of arrows 227. It shows the disposition of the output waveguides' central axes 228a to 228d respectively in relation to the input and multimode waveguides' central axis 230. It is a transverse section perpendicular to the longitudinal axes 228a to 228d and 230. Each output waveguide axis such as 228a is offset by $b/\sqrt{2}$ from the multimode axis 230. These offsets are diagonally upward and downward, and to the left and right. This locates the output waveguide axes centrally of respective quarters of the transverse cross-sectional area of the multimode waveguide 224.

The beamsplitter 220 is equivalent to a two-dimensional version of the beamsplitter 10 of FIG. 1. This is because the central waveguide 224 is multimode in both transverse dimensions. Consequently the fundamental mode of the input waveguide excites symmetric modes of the multimode waveguide in both transverse dimensions, ie modes $EH_{mn}$ where m and n are both odd and both can take values greater than unity. In the beamsplitter 10, a restriction of m=1 applied because the multimode waveguide 20 in the vertical dimension was limited to monomode operation. Because of the transverse two-dimensional nature of the multimode waveguide 224, radiation propagating in the input waveguide (fundamental mode) gives rise to four half-cycle sinusoidal intensity maxima (not shown) centred on the output waveguide axes 228a to 228d. The intensity distribution in the plane of FIG. 18 is equivalent to two versions of curve 75 in FIG. 8 arranged one below the other. In consequence, the beamsplitter 220 provides 1 to 4 way beamsplitting with all four output beams in phase. This beamsplitter could provide a fibre optic multiway coupler if the input and output waveguides were fibre optics.

The beamsplitters 10 and 220 may be adapted for use as laser devices. In this case, they would be operated with the output waveguides 22/24 or 226a etc filled with a laser gain medium and arranged for excitation of the medium. For example, the waveguides 22 and 24 might be filled with $CO_2$ gas and have radio-frequency excitation electrodes and associated circuitry. Laser mirrors would be located at ends of the input and output waveguides 18 and 22/24 remote from the multimode waveguide 20. The mirror associated with the input waveguide would be a partially transmissive output coupler mirror. The other mirror would be as fully reflecting as possible. Laser action in the output waveguides would give rise to beams combined into one in the input waveguide. The partially reflecting mirror would output a fraction of the combined beam to free space and return the remainder to provide feedback. This feedback would be divided equally between the output or laser gain waveguides. The arrangement is possible because an in-phase fundamental mode maximum (eg 70a) at the input waveguide gives rise to in-phase maxima (eg 75a, 75b) at the output guides. Consequently, there is in-phase recombination and division of radiation in passing from the output waveguides to the input waveguide and returning respectively.

Referring now to FIGS. 19 and 20, these respectively show schematic plan and side elevations of a further embodiment of the invention configured as a laser indicated generally by 240. The laser 240 incorporates an alumina waveguide body portion 242. The latter consists of five sections 244 to 252, these being hollowed to provide respectively a single monomode output waveguide 254, a first multimode waveguide 256 L/2 in length, four monomode laser waveguides 258, a second multimode waveguide 260 L/2 in length, and two monomode feedback waveguides 262. The feedback waveguides 262 are connected centrally of respective halves of the second multimode waveguide 260, and the laser waveguides 258 are connected centrally of respective quarters of both multimode waveguides 256 and 260. The laser waveguides 258 have radio frequency (RF) excitation electrodes 264 of conventional kind.

The laser 240 incorporates a partially reflecting mirror (output coupler) 266 adjacent the output waveguide 254 and a fully reflecting mirror 268 adjacent the feedback waveguides 262. The waveguides 254 to 262 are filled with $CO_2$ gas as a laser medium, and laser gain is provided in the laser waveguides 258 by RF excitation.

The laser 240 is equivalent to the beamsplitter 10 with the central waveguide 20 being divided into two halves and four parallel monomode laser waveguides 258 being inserted to connect the two halves. Laser radiation reflected from the output coupler mirror 266 passes along the output waveguide 254 and is divided into four (with unequal phasing) by the first multimode waveguide 256. This is shown by curves 70 and 72 in FIG. 8, in which 1 to 4 way splitting occurs in a length L/2 of multimode waveguide. The radiation is amplified in the laser waveguides 258. It passes to the second multimode waveguide 260, which recombines it into two beams (which are in-phase) in the feedback waveguides 262. This transformation is that between curves 72 and 75 in FIG. 8. The radiation is reflected at the fully reflecting mirror 268. It retraces its path to the output waveguide 254 for partial reflection and partial transmission at the output coupler mirror 266. Transmission provides an output beam indicated by an arrow 270.

If additional laser waveguides are required to augment the gain, these may be provided. However, the lengths of the multimode waveguides 256 and 260 require altering to provide 1 to N way splitting followed by reestablishment of in-phase conditions. For example, six laser waveguides could be accommodated by a first multimode waveguide L/3 long and a second multimode waveguide 2L/3 long. This would provide 1 to 6 way out of phase splitting (as between curves 70 and 71 in FIG. 8) followed by 6 to 2 way in-phase recombination (as between curves 71 and 75). The arrangement of FIGS. 19 and 20 consequently provides a means for phase-locking an array of laser waveguides. They also demonstrate the reversibility of devices of the invention as regards light path, provided that any necessary phase adjustments are made.

The foregoing description has discussed hollow and solid waveguides for use at infra-red wavelengths of about 1 $\mu$m and 10 $\mu$m. It is also possible to design waveguide systems to implement the invention at visible and microwave wavelengths.

Referring now to FIG. 21, there is shown a horizontal sectional plan view of a further embodiment of a beamsplitter of the invention. This is indicated generally by 280. The beamsplitter 280 incorporates what may be referred to as a "compound" multimode waveguide 282. The compound waveguide 282 has first and second sections 282a and 282b with a common axis 284. The latter are of like height 2a, but their respective widths are $2b_1$ and $2b_2$ where $b_2$ is greater than $(b_1+a)$. They have respective lengths given by:

$$L_1 = 2b_1^2/\lambda \tag{19.1}$$

$$L_2 = 2b_2^2/\lambda \tag{19.2}$$

A single input waveguide 286 of width and height 2a is connected coaxially to an outer end 288 of the first waveguide section 282a. Four output waveguides 290a to 290d are connected to an outer end 292 of the second waveguide section 282b. Cartesian axes for the y and z directions are indicated at 294; the z axis is treated as being the device longitudinal axis 284. The locations of the output waveguide centres 290ac to 290dc in the y direction are given by:

$$290ac, \ y = (b_2 = b_1)/2 \tag{20.1}$$

$$290bc, \ y = (b_2 - b_1)/2 \tag{20.2}$$

$$290cc, \ y = -(b_2 - b_1)/2 \tag{20.3}$$

$$290dc, \ y = -(b_2 + b_1)/2 \tag{20.4}$$

In view of the detailed analyses of previously described embodiments of the invention, the mode of operation of the beamsplitter 280 will be described briefly. A fundamental mode excitation from the input waveguide 286 produces beam splitting into two. This occurs at $y = \pm b_1/2$ in a plane 294 where the waveguide sections 282a and 282b merge. These two beam divisions (not shown) are equivalent to maxima 75a and 75b in FIG. 8, and are in-phase. They collectively excite symmetric modes of the second waveguide section 282b. It can be shown by an analysis similar to that given earlier that modal dispersion in this section 282b produces four beam divisions of equal intensity centred on the output waveguide centres 290ac to 290bc. In consequence, the beamsplitter 280 provides 1 to 4 way beam division in a length $(L_1+L_2)$ at centres which are not periodically spaced (except when $b_2 = 2b_1$). Compound multimode waveguides having more than two sections cascaded together may also be used on the lines indicated in FIG. 21.

In addition to those embodiments previously described, further devices of the invention have been constructed in AlGaAs, and their performance tested. FIG. 22 illustrates results obtained from three different one to twenty way beamsplitters of the invention. The three beamsplitters were designed to be of slightly different lengths to investigate tolerance of the invention to inaccuracies in production. Graph 300 illustrates results from a first of these three beamsplitters having a multimode waveguide which was designed to have dimensions height $2a=2.6$ μm, width $2b=120$ μm and length $L=2310$ μm. Graphs 302 and 304 illustrate results from the second and third of these beamsplitters, in which multimode waveguide height and width were designed to be of like dimensions and multimode waveguide length was designed to be 2330 μm and 2350 μm respectively.

As can be clearly seen from graphs 300 and 302, the first and second of the beamsplitters split a single input beam into twenty output beams of approximately equal intensity. Graph 304 for the third beamsplitter actually shows splitting into nineteen beams of approximately equal intensity. This is due to damage of an output guide which should have carried a beam on the extreme right hand side. The average output beam intensity illustrated by graph 300 is significantly lower than the average output beam intensity illustrated by graphs 302 and 304. This may be due to less efficient injection into the input fundamental mode waveguide of the first beamsplitter when compared to the second and third. Alternatively it may be that the actual dimensions of the first beamsplitter are furthest from the "correct" dimensions. The performance of the second and third beamsplitters is very similar.

In practice it has been found that devices of the invention are far less sensitive to slight departures from dimensions calculated to be necessary than are prior art devices based on self-imaging waveguides. Indeed, this is a significant advantage over the prior art since greater tolerances on dimensions may be permitted during device production, thus reducing failure rates and production costs. It also indicates that devices of the invention will be less sensitive to temperature induced changes in width and length. To a first approximation sensitivity of device operation to dimension errors as a result of production techniques, to temperature induced dimension changes and to waveguide wall roughness will scale with multimode waveguide length. Prior art devices based on self-imaging waveguides are four times longer than devices of the invention, and will be four times more sensitive to manufacturing errors and temperature change.

Referring now to FIG. 23, results obtained from a Mach-Zehnder interferometer of the invention are illustrated graphically. The Mach-Zehnder interferometer was generally of the form described in relation to FIG. 10 with dimensions as follows: $2a=2.6$ μm, $2b=32$ μm, multimode waveguides of length 1725 μm, and electrodes 1.0 μm wide and 6 mm long. Each of graphs 310 to 322 illustrates output intensity distribution from the interferometer for a different voltage applied to the phase shifter, the voltages being 0 V, 5 V, 10 V, 15 V, 20 V, 25 V and 30 V respectively. FIG. 23 illustrates the Mach-Zehnder interferometer operating as previously described.

The efficiency of devices of the invention was investigated as follows. Five one-to-one devices of the invention were constructed each consisting of a multimode waveguide connected to fundamental mode square section input and output waveguides. Multimode waveguide dimensions were $2a=2.6$ μm, $2b=12$ μm and length 516 μm. Input and output waveguides were $2.6 \times 2.6 \times 500$ μm approximately. Five such devices were connected together to form a line. The transmission efficiency through this line was compared with that of a fundamental mode comparison square waveguide of section 2.6 μm square and of like overall length. Light detected at the output of the line of devices was 135% of the intensity detected at the output of the comparison fundamental mode waveguide. Since the fifth root of 1.35 is about 1.06, each device of the invention transmitted approximately 6% more light than was transmitted by a like length of the comparison fundamental mode waveguide.

We claim:

1. An optical device including a multimode waveguide having a transverse cross-section wherein:
   (a) a first coupling waveguide, operating in a fundamental mode operation, is connected to the multimode waveguide centrally of the multimode waveguide's transverse cross-section,
   (b) at least two second coupling waveguides, each operating in a fundamental mode operation, are connected to the multimode waveguide with port centers spaced apart across the multimode waveguide's transverse cross-section,
   (c) said first coupling waveguide and said multimode waveguide comprise a means for propagating an in-phase symmetric fundamental mode of the first coupling waveguide and for exciting only symmetric modes of the multimode waveguide, and said multimode waveguide and said second coupling waveguide comprise a means for exciting a fundamental mode of each second coupling waveguide by modal dispersion along a path of radiation within the multimode waveguide.

2. An optical device according to claim 1 wherein the coupling and multimode waveguides are formed as hollows within solid dielectric material.

3. An optical device according to claim 2 wherein the dielectric material is alumina.

4. An optical device according to claim 1 wherein the coupling and multimode waveguides are formed as ridge waveguides upstanding from a substrate.

5. An optical device according to claim 4 formed of layers of materials of a ternary or quaternary semiconductor material system.

6. An optical device according to claim 5 wherein the semiconductor material system is $Al_xGa_{1-x}As$.

7. An optical device according to claim 1 wherein the coupling and multimode waveguides are formed in a common stratum or a common series of strata, and the second coupling waveguides have port centers substantially coplanar with the multimode waveguide axis.

8. An optical device according to claim 1 wherein the multimode waveguide is multimode in two mutually orthogonal transverse directions, and wherein the second coupling waveguides are disposed as a two dimensional array of such waveguides.

9. An optical device according to claim 1 wherein the second coupling waveguides incorporate a laser gain medium and means for exciting the medium, further including means for optical feedback with appropriate phasing for achieving laser action.

10. An optical device according to claim 9 further including a second multimode waveguide connected to the second coupling waveguides remote from the first multimode waveguide, the second multimode waveguide being arranged to provide appropriate phasing for achieving laser action.

11. An optical device according to claim 1 comprising a Mach Zehnder interferometer, and including two second coupling waveguides connecting the multimode waveguide to a subsidiary multimode waveguide and thence to a central output waveguide between an outer pair of output waveguides, and means for varying the optical phase in one second coupling waveguide relative to the optical phase in the other, wherein in-phase radiation in the coupling waveguides gives rise to intensity at least substantially confined to the central output waveguide, and radiation in relative antiphase in the coupling waveguides gives rise to substantially equal intensities in the outer pair of output waveguides.

12. An optical device comprising a Mach Zehnder interferometer, including:
   (a) a first multimode waveguide having a transverse cross-section,
   (b) a first coupling waveguide, operating in a fundamental mode operation, connected to the first multimode waveguide centrally of the first multimode waveguide's transverse cross-section,
   (c) two second coupling waveguides, each operating in a fundamental mode operation, connected to the first multimode waveguide with port centers spaced apart across the first multimode waveguide's transverse cross-section, said first coupling waveguide and first multimode waveguide comprise a means for propagating an in-phase symmetric fundamental mode of the first coupling waveguide and for exciting only symmetric modes of the first multimode waveguide, and said first multimode waveguide and said second coupling waveguides comprising a means for exciting a fundamental mode of each second coupling waveguide by modal dispersion along a path of radiation within the first multimode waveguide,
   (d) a second multimode waveguide connected to the two second coupling waveguides,
   (e) means for varying the optical phase in one of said second coupling waveguide relative to the optical phase in the other,
   (f) three output waveguides comprising a central output waveguide and an outer pair of output waveguides, said central waveguide located between said outer pair of output waveguides, the output waveguides connected to said second multimode waveguide, wherein in-phase radiation in the second coupling waveguides gives rise to intensity substantially confined to the central output waveguide, and relative antiphase radiation in the second coupling waveguides gives rise to substantially equal intensities in the outer pair of output waveguides.

13. An optical device incorporating:
   (a) a multimode waveguide having a transverse cross-section, said waveguide is multimode in two mutually orthogonal transverse directions,
   (b) a first coupling waveguide, operating in a fundamental mode operation, connected to the first multimode waveguide centrally of the first multimode waveguide's transverse cross-section,
   (c) two dimensional array of second waveguides, each operating in a fundamental mode operation, connected to the multimode waveguide with port centers spaced apart across the multimode waveguide's transverse cross-section, said first coupling waveguide and said multimode waveguide comprise a means for propagating an in-phase symmetric fundamental mode of the first coupling waveguide and for exciting only symmetric modes of the multimode waveguide and said multimode waveguide and said second coupling waveguides comprise a means for exciting a fundamental mode of each second coupling waveguide by modal dispersion along a path of radiation within the multimode waveguide.

14. A laser optical device comprising:
   (a) a multimode waveguide having a transverse cross-section,
   (b) a first coupling waveguide, operating in a fundamental mode operation, connected to the multimode waveguide centrally of the multimode waveguide's transverse cross-section,
   (c) a plurality of second coupling waveguides, each operating in a fundamental mode operation connected to the multimode waveguide with port centers spaced apart across the multimode waveguide's transverse cross-section, said first coupling waveguide and said multimode waveguide comprise a means for propagating an in-phase symmetric fundamental mode of the first coupling waveguide and for exciting only symmetric modes of the multimode waveguide, and said multimode waveguide and said second coupling waveguide comprise a means for exciting a fundamental mode of each second coupling waveguide by modal dispersion along a path of radiation within the multimode waveguide,
   (d) a laser gain medium incorporated in said second coupling waveguides,
   (e) means for exciting the laser gain medium, and
   (f) means for providing optical feedback in the laser gain medium for achieving laser action.

15. A laser optical device comprising:
   (a) a first multimode waveguide having a transverse cross-section,
   (b) a first coupling waveguide, operating in a fundamental mode operation, connected to the first multimode waveguide centrally of the first multimode waveguides' transverse cross-section,
   (c) a plurality of second coupling waveguides, each operating in a fundamental mode operation, and connected to the first multimode waveguide with port centers spaced apart across the first multimode waveguide's transverse cross-section,
   (d) a laser gain medium incorporated in the second coupling waveguides,
   (e) means for exciting the laser gain medium,
   (f) a second multimode waveguide connected to the second coupling waveguides,
   (g) two third coupling waveguides, each operating in a fundamental mode operation and connected to the second multimode waveguide,
   (h) two laser mirrors comprising means for at least partial retroreflection of laser radiation emergent respectively from the first and third coupling waveguides, wherein radiation propagating as an in-phase symmetric fundamental mode of the first coupling waveguide excites only symmetric modes of the first multimode waveguide, symmetric modes of the first multimode waveguide excite the fundamental mode of each second coupling waveguide by modal dispersion along the path of radiation within the first multimode waveguide, and radiation passing from the second coupling waveguides to the second multimode waveguide undergoes modal dispersion and excites only the fundamental mode of each third coupling waveguide.

16. An optical device incorporating:
   (a) a first multimode waveguide having a transverse cross-section, (b) a first coupling waveguide, operating in a fundamental mode operation, connected to the first multimode waveguide centrally of the first multimode waveguide's transverse cross-section,
(c) a second multimode waveguide connected to the first multimode waveguide,
(d) second coupling waveguides connected to the second multimode waveguide, and
(e) wherein said first multimode waveguide and said first coupling waveguide comprise a means for propagating an in-phase symmetric fundamental mode of the first coupling waveguide and for exciting only the first multimode waveguide's symmetric modes which would undergo modal dispersion and for exciting only the second multimode waveguide's symmetric modes, which would also undergo modal dispersion and thereby exciting the fundamental mode of each second coupling waveguide.

* * * * *